United States Patent
Lee et al.

(10) Patent No.: US 8,980,673 B2
(45) Date of Patent: Mar. 17, 2015

(54) SOLAR CELL AND METHOD OF MANUFACTURING THE SAME

(71) Applicant: LG Siltron Inc., Gyeongbuk (KR)

(72) Inventors: Keon Jae Lee, Daejeon (KR); Sang Yong Lee, Gwangju (KR); Seung Jun Kim, Daejeon (KR)

(73) Assignees: LG Siltron Incorporated, Gumi-si, Gyeongbuk (KR); Korea Advanced Institute of Science, Daejeon (KR)

( * ) Notice: Subject to any disclaimer, the term of this patent is extended or adjusted under 35 U.S.C. 154(b) by 0 days.

(21) Appl. No.: 14/168,920

(22) Filed: Jan. 30, 2014

(65) Prior Publication Data

US 2014/0147957 A1    May 29, 2014

Related U.S. Application Data

(62) Division of application No. 12/875,807, filed on Sep. 3, 2010.

(30) Foreign Application Priority Data

Sep. 17, 2009   (KR) .................... 10-2009-0087818

(51) Int. Cl.
*H01L 21/00*   (2006.01)
*H01L 31/18*   (2006.01)
(Continued)

(52) U.S. Cl.
CPC ........ *H01L 31/1856* (2013.01); *H01L 31/0304* (2013.01); *H01L 31/0392* (2013.01); *H01L 31/1852* (2013.01); *H01L 31/0725* (2013.01); Y02E 10/544 (2013.01)
USPC ................. 438/64; 438/67; 438/68; 438/113; 438/114; 136/244

(58) Field of Classification Search
CPC ... H01L 25/042; H01L 25/047; H01L 25/045; H01L 31/02021; H01L 31/042; H01L 31/1804
USPC ................. 438/67, 68, 113, 114, 64; 136/244
See application file for complete search history.

(56) References Cited

U.S. PATENT DOCUMENTS 4,892,592 A * 1/1990 Dickson et al. ................ 136/244
5,710,057 A * 1/1998 Kenney .......................... 438/406
(Continued)

FOREIGN PATENT DOCUMENTS

JP         200727693      2/2007
KR      1020050052480    6/2005
(Continued)

OTHER PUBLICATIONS

Menard, E. et al., "A Printable Form of Silicon for High Performance Thin Film Transistors on Plastic Substrates," Applied Physics Letters, vol. 84, No. 26, Jun. 28, 2004, p. 5398-5400.
(Continued)

*Primary Examiner* — Jarrett Stark
*Assistant Examiner* — Mohammad M Hoque
(74) *Attorney, Agent, or Firm* — McKenna Long & Aldridge LLP

(57) ABSTRACT

Provided are a solar cell and a method of manufacturing the same. The method of manufacturing the solar cell includes stacking a solar cell device layer containing GaN on a sacrificial substrate, etching the solar cell device layer to expose the sacrificial substrate, thereby forming one or more solar cell devices comprising the solar cell device layer, anisotropically etching the exposed sacrificial substrate, contacting the solar cell devices to a stamping processor to remove the solar cell devices from the sacrificial substrate, and transferring the solar cell devices onto a receiving substrate. A high temperature semiconductor process may be performed on a substrate such as a silicon substrate to transfer the solar cell devices onto the substrate, thereby manufacturing flexible solar cells. Also, a large number of solar cells may be excellently aligned on a large area. In addition, economical solar cells may be manufactured.

7 Claims, 29 Drawing Sheets

(51) Int. Cl.
  *H01L 31/0304* (2006.01)
  *H01L 31/0392* (2006.01)
  *H01L 31/0725* (2012.01)

(56) References Cited

U.S. PATENT DOCUMENTS

| | | | |
|---|---|---|---|
| 6,071,795 | A * | 6/2000 | Cheung et al. ............ 438/458 |
| 6,805,809 | B2 | 10/2004 | Nuzzo et al. |
| 7,148,514 | B2 * | 12/2006 | Seo et al. .................... 257/79 |
| 7,622,367 | B1 | 11/2009 | Nuzzo et al. |
| 7,662,545 | B2 | 2/2010 | Nuzzo et al. |
| 7,777,241 | B2 | 8/2010 | Moustakas et al. |
| 7,943,440 | B2 | 5/2011 | Kim et al. |
| 8,101,498 | B2 | 1/2012 | Pinnington et al. |
| 8,198,621 | B2 | 6/2012 | Rogers et al. |
| 8,372,726 | B2 | 2/2013 | Graff et al. |
| 2004/0055894 | A1 | 3/2004 | Iwasaki et al. |
| 2005/0110029 | A1 * | 5/2005 | Aoyagi et al. ............... 257/94 |
| 2005/0284517 | A1 * | 12/2005 | Shinohara ................. 136/256 |
| 2006/0094145 | A1 * | 5/2006 | Otsuka et al. ............... 438/31 |
| 2007/0032089 | A1 | 2/2007 | Nuzzo et al. |
| 2007/0074651 | A1 * | 4/2007 | Lee ............................. 117/89 |
| 2007/0254490 | A1 * | 11/2007 | Jain ........................... 438/736 |
| 2009/0199960 | A1 | 8/2009 | Nuzzo et al. |
| 2009/0278161 | A1 * | 11/2009 | Lee et al. .................... 257/99 |
| 2009/0283145 | A1 * | 11/2009 | Kim et al. .................. 136/261 |
| 2010/0151627 | A1 * | 6/2010 | Kim et al. .................. 438/113 |
| 2011/0143467 | A1 * | 6/2011 | Xiong et al. ................ 438/29 |
| 2011/0146759 | A1 * | 6/2011 | Lee et al. ................... 136/249 |

FOREIGN PATENT DOCUMENTS

| | | |
|---|---|---|
| KR | 1020070037484 | 4/2007 |
| KR | 100798431 | 1/2008 |
| KR | 1020090086199 | 8/2009 |
| WO | 2006130721 | 12/2006 |
| WO | 2009057194 | 5/2009 |
| WO | 2009123306 | 10/2009 |

OTHER PUBLICATIONS

Lee, Keon Jae et al., "Fabrication of Stable Metallic Patterns Embedded in Poly (dimethylsiloxane) and Model Applications in Non-Planar Electronic and Lab-on-a-Chip Device Patterning," Advanced Functional Materials, 2005, 15, No. 4, April, p. 557-566.

Childs, William R., "Masterless Soft Lithography: Patterning UV/Ozone—Induced Adhesion on Poly (dimethylsiloxane) Surfaces," Langmuir, 2005, 21, p. 10096-10105.

Lee, Keon Jae et al., "Large-Area, Selective Transfer of Microstructured Silicon: A Printing-Based Approach to High-Performance Thin-Film Transistors Supported on Flexible Substrates," Advanced Materials, 2005, 17, p. 2332-2336.

Lee, Keon Jae et al., "A Printable Form of Single-Crystalline Gallium Nitride for Flexible Optoelectronic Systems," Small Journal, 2005, 1, No. 12, p. 1164-1168.

Meitl, Matthew A. et al., "Transfer Printing by Kinetic Control of Adhesion to an Elastomeric Stamp," Nature Materials, vol. 5, Jan. 2006, p. 33-38.

Ahn, Heejoon et al., "Additive Soft-Lithographic Patterning of Submicromete- and Nanometer-Scale Large-Area Resists on Electronic Materials," Nano Letters, 2005, vol. 5, No. 12, p. 2533-2537.

Ahn, Heejoon et al., "Micron and submicron patterning of polydimethlysiloxane resists on electronic materials by decal transfer lithography and reactive ion-beam etching: Application to the fabrication of high-mobility, thin-film transistors," Journal of Applied Physics, 100, 084907, 2006, p. 084907-1-084907-7.

Ahn, Jong-Hyun et al., "High-Speed Mechanically Flexible Single-Crystal Silicon Thin-Film Transistors on Plastic Substrates," IEEE Electron Device Letters, vol. 27, No. 6, Jun. 2006.

Lee, Keon Jae et al., "Bendable GaN high electron mobility transistors on plastic substrates," Journal of Applied Physics, 100, 2006, p. 125407-1-125407-4.

Ahn, Jong-Hyun et al., "Heterogeneous Three-Dimensional Electronics by Use of Printed Semiconductor Nanomaterials," Science 314, 2006, p. 1754-1757.

Ahn, Jong-Hyun et al., "Bendable integrated circuits on plastic substrates by use of printed ribbons on single-crystalline silicon," Applied Physics Letters, 90, 2007, p. 213501-1-213501-3.

Kim, Dae-Hyeong et al., "Complementary Logic Gates and Ring Oscillators on Plastic Substrates by Use of Printed Ribbons on Single-Crystalline Silicon," IEEE Electron Device Letters, vol. 29, No. 1, Jan. 2008, p. 73-76.

Lee, Keom Jae et al., "Fabrication of microstructured silicon (μs-Si) from a bulk Si wafer and its use in the printing of high-performance thin-film transistors on plastic substrates," Journal of Micromechanics and Microengineering, 20 (2010), 075018, p. 1-8.

Park, Kwi-Il et al., "Bendable and Transparent Barium Titanate Capacitors on Plastic Substrates for High Performance Flexible Ferroelectric Devices," Electrochemical and Solid-State Letters, 13 (7), 2010, p. G57-G59.

Kloeppel, James E., "Printable silicon for ultrahigh performance flexible electronic systems," http://www.eurekalert.org/pub_releases/2004-06/uoia-psf061704.php (1 of 2) Jul. 28, 2004.

Yugang, Sun, Jong-Hyun Ahn, John A. Rogers, "Printable semiconductors for flexible electronics," in AccessScience, McGraw-Hill Education, 2007.

* cited by examiner

FIG.2
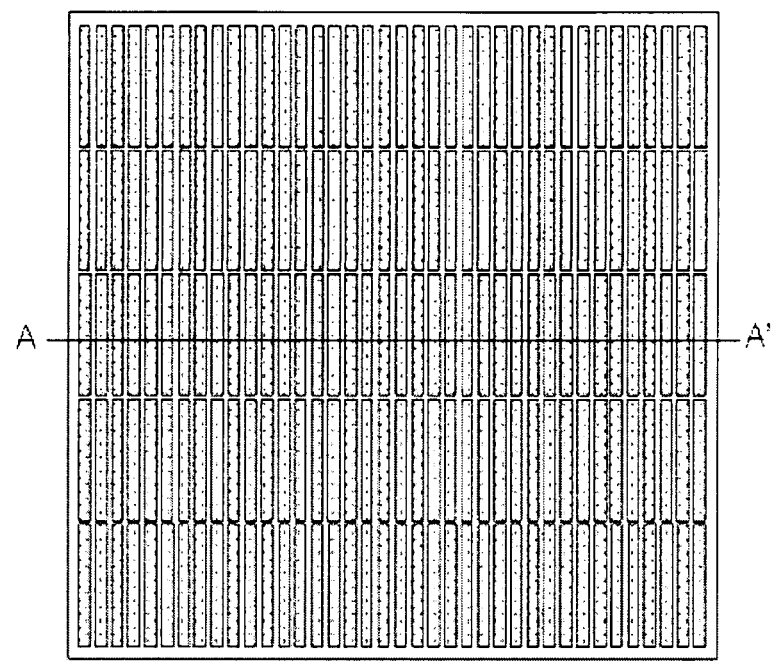
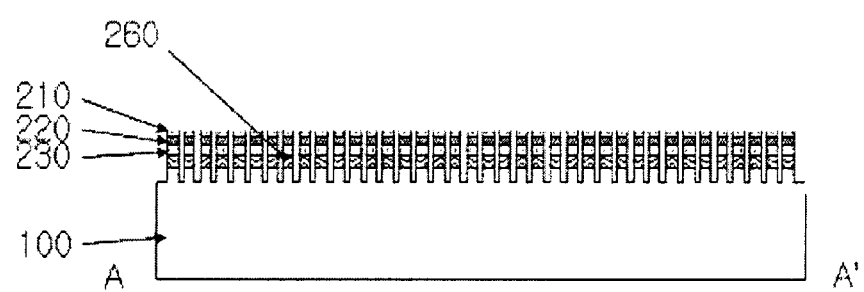

FIG.5
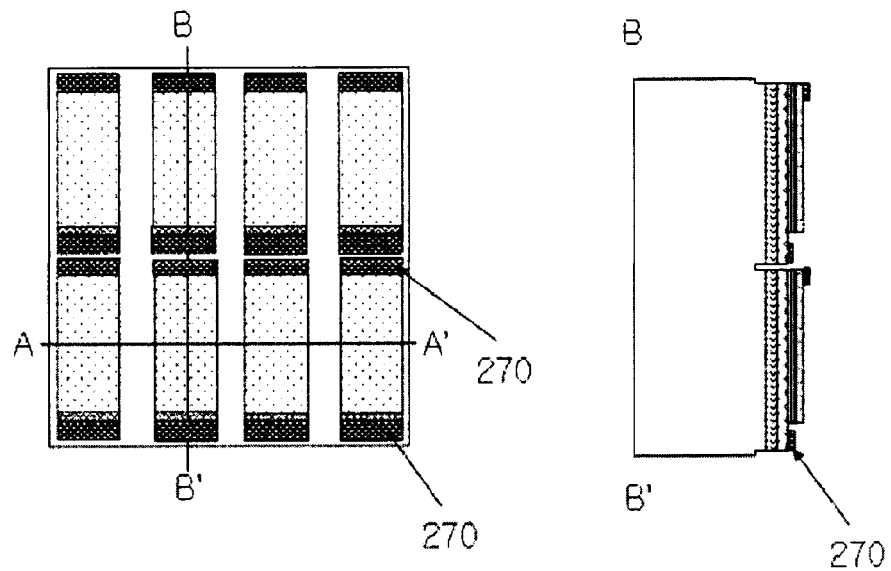
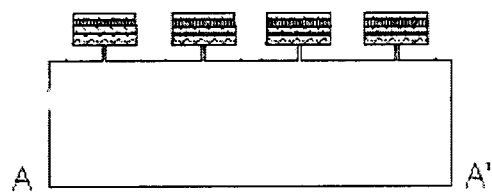

FIG.6
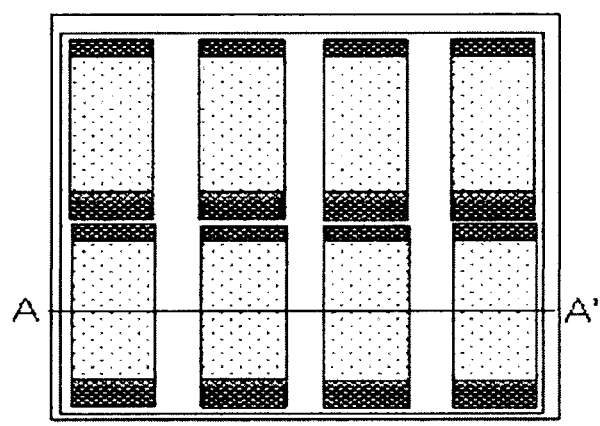
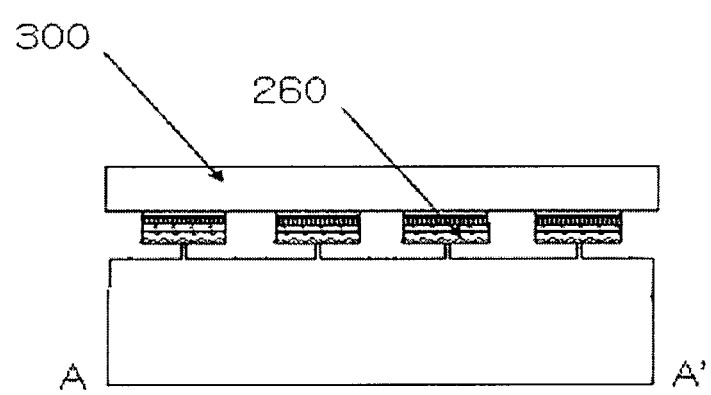

FIG.7
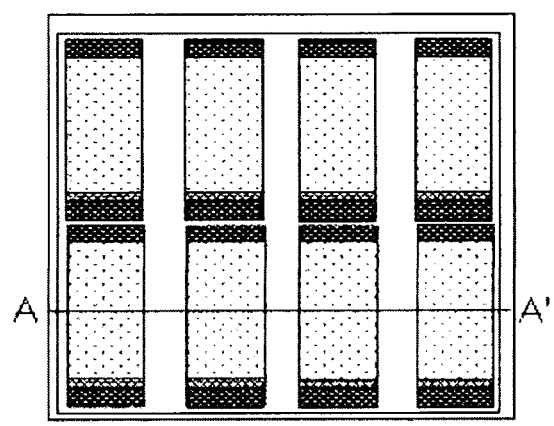
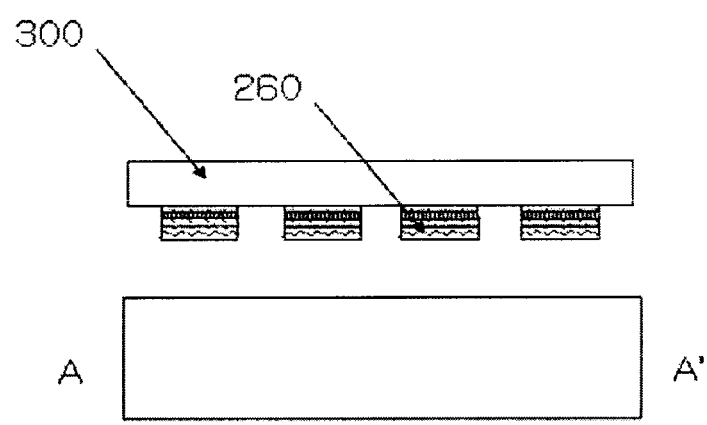

FIG.9
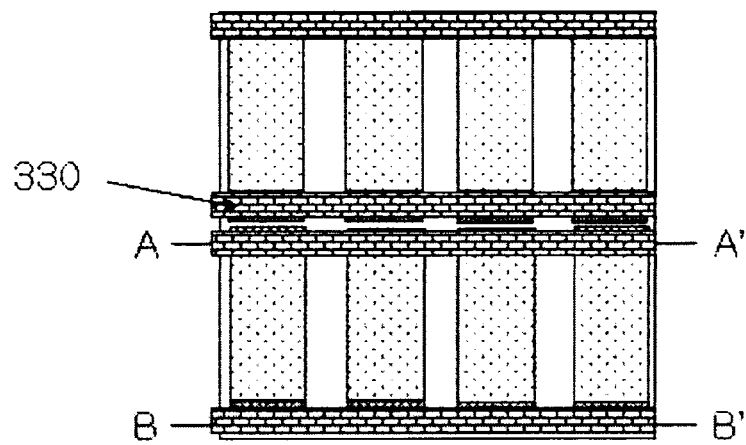
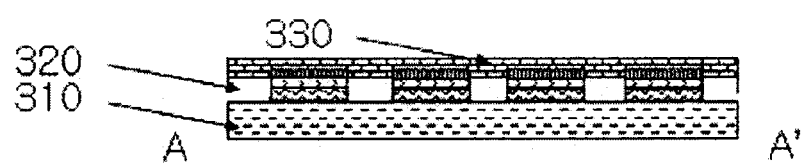
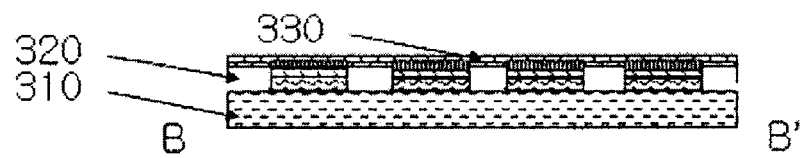

FIG. 13
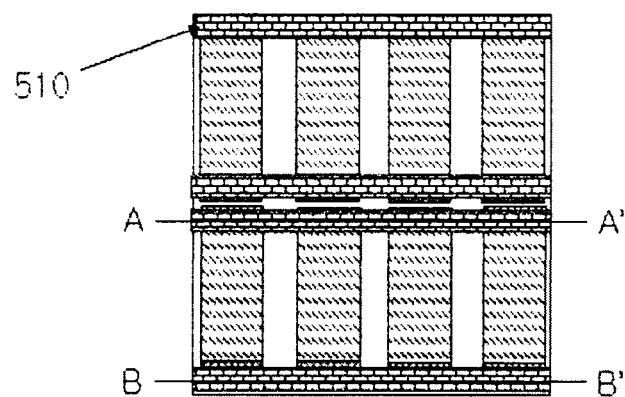
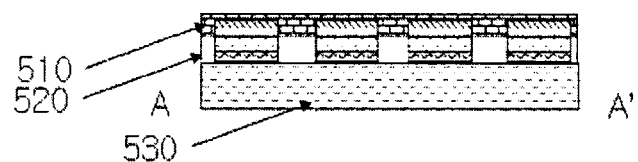
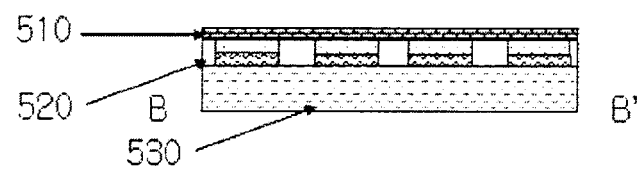

FIG.24
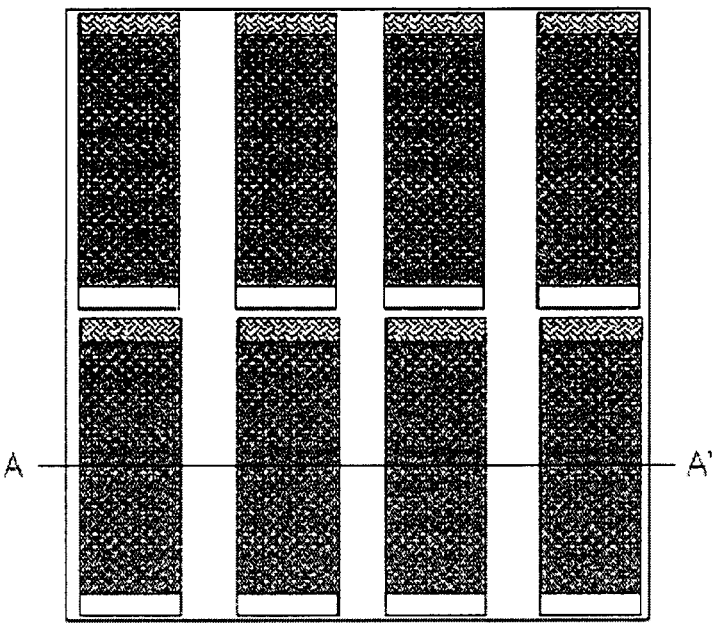
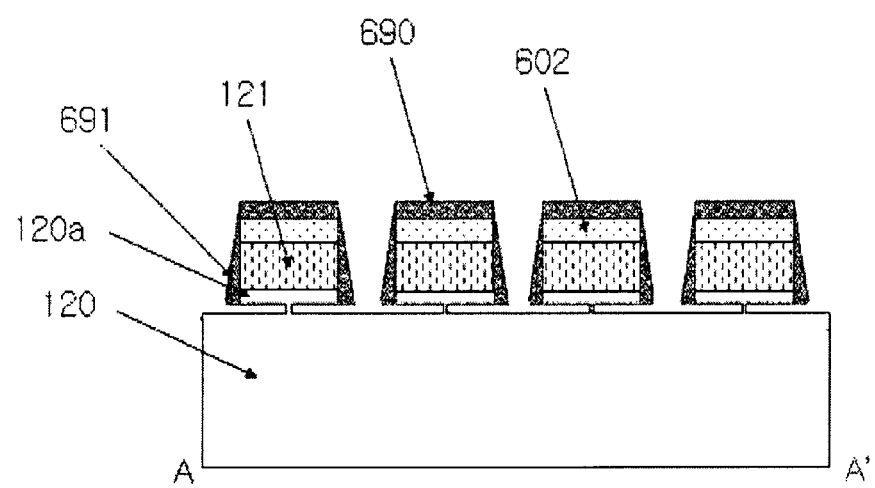

FIG. 26
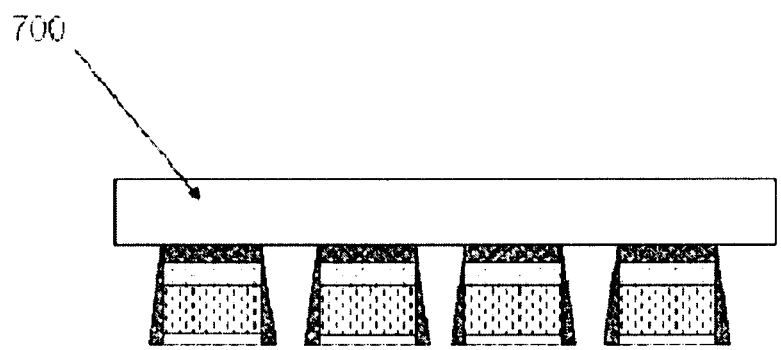
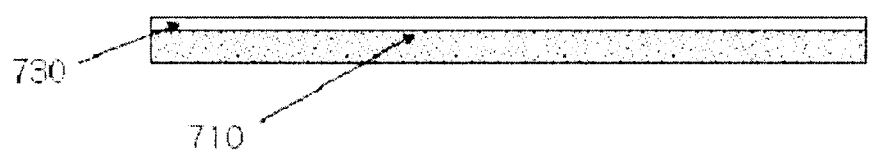

FIG.30
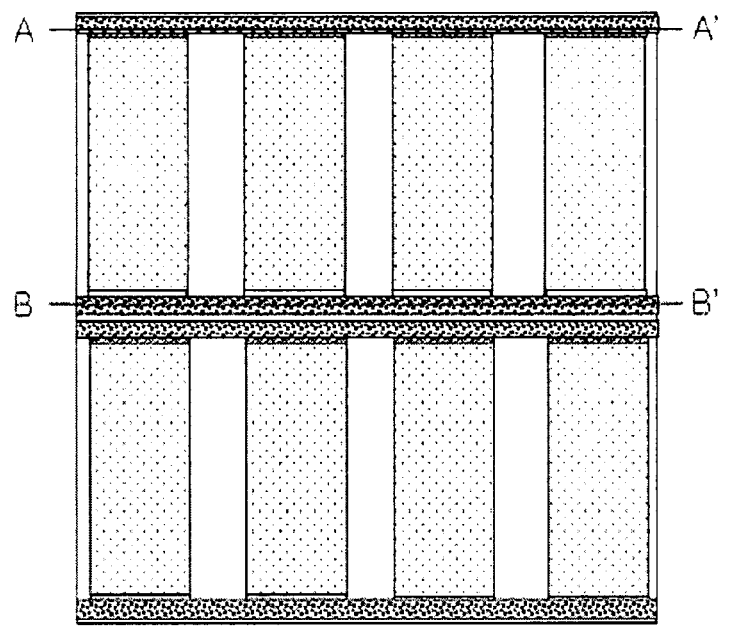
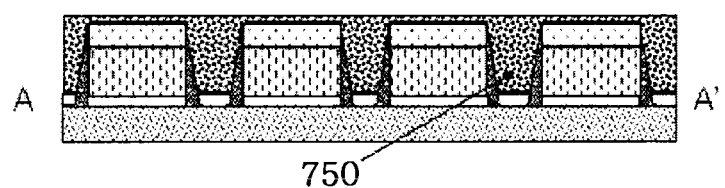
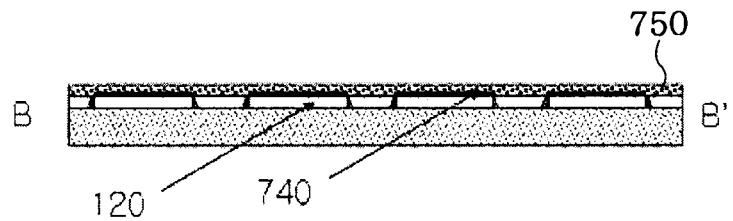

SOLAR CELL AND METHOD OF MANUFACTURING THE SAME

CROSS-REFERENCE TO RELATED APPLICATIONS

The present application is a divisional of, and claims the benefit under 35 U.S.C. 120 and 35 U.S.C. 121 to U.S. patent application Ser. No. 12/875,807, filed Sep. 3, 2010 and claims priority under 35 U.S.C. 119 and 35 U.S.C. 365 to Korean Patent Application No. 10-2009-0087818, filed on Sep. 17, 2009, each of which is hereby incorporated by reference in its entirety.

BACKGROUND

The present disclosure relates to a solar cell and a method of manufacturing the same.

Solar cells are devices that convert solar light into an electric energy. Also, the solar cells may be referred to electronic devices that generate electricity using two types of semiconductor such as a P-type semiconductor and an N-type semiconductor. A principle of such a solar cell is described as follows. First, when light is irradiated onto the solar cell, electrons and holes are generated within the solar cell. The generated charges are moved into P and N poles. As a result, an electric potential difference is generated between the P pole and the N pole, and thus, current flows due to the electric potential difference.

Solar cells attracting more attention due to an exhaustion of energy resources have efficiency of about 25%. Thus, solar cells formed of various materials and having efficiency greater than that of a related art silicon solar cell are being disclosed. For example, one of the solar cells may include a GaN-based solar cell. Among these, InGaN was widely used as an active material for a related art LED having an emission length of a range from a UV region to a green spectrum region or a laser diode. However, since InGaN is capable of adjusting a band gap in all alloy fields, InGaN is in the spotlight as a material of a novel solar cell having characteristics such as high carrier mobility, a high drift velocity, radiation resistance, and a light absorption property of about 105 cm-1 that is about a band boundary.

However, a GaN-based solar cell reported up until the present day has a structure in which a rigid substrate such as a silicon or sapphire substrate includes an InGaN layer. Thus, an InGaN-based solar cell realized on a flexible substrate does not have been disclosed up to now. Furthermore, there is a limitation that an extreme manufacturing process of a solar cell such as a high-temperature semiconductor process extremely limits a substrate selection range.

SUMMARY

Embodiments provide a solar cell realized on a flexible substrate and a method of manufacturing the same.

In one embodiment, a method of manufacturing a solar cell includes: stacking a solar cell device layer containing GaN on a sacrificial substrate; etching the solar cell device layer to expose the sacrificial substrate, thereby forming one or more solar cell devices including the solar cell device layer; anisotropically etching the exposed sacrificial substrate; contacting the solar cell devices to a stamping processor to remove the solar cell devices from the sacrificial substrate; and transferring the solar cell devices onto a receiving substrate.

In another embodiment, a method of manufacturing a solar cell includes: doping p-type impurities into a silicon substrate to form a p-doped layer; stacking a solar cell device layer containing InGaN on the silicon substrate to form a solar cell device having one or more tandem structure of a lower silicon solar cell device layer including the p-doped layer and an upper GaN solar cell including a GaN solar cell device layer; stacking a protection layer on the solar cell device layer having the tandem structure to pattern the protection layer; etching the entire device layer and the lower silicon substrate by a predetermined depth in a vertical direction; forming spacers on lateral surfaces of the etched device layer and the silicon substrate etched by the predetermined depth; anisotropically etching the silicon substrate exposed between the spacers; contacting the solar cell devices to a stamping processor to remove the solar cell devices from the sacrificial substrate; and transferring the solar cell devices onto a receiving substrate.

In further another embodiment, a solar cell includes: a substrate; a polymer layer on the substrate; solar cell devices spaced from each other on the substrate; and a conductive layer electrically connecting an n-type electrode and a p-type electrode of the respective solar cell devices to each other.

According to the embodiments, a high temperature semiconductor process may be performed on a substrate such as a silicon substrate to transfer the solar cell devices onto the substrate, thereby manufacturing flexible solar cells. Also, a large number of solar cells may be excellently aligned on a large area. In addition, economical solar cells may be manufactured.

The details of one or more embodiments are set forth in the accompanying drawings and the description below. Other features will be apparent from the description and drawings, and from the claims.

BRIEF DESCRIPTION OF THE DRAWINGS

FIGS. 1 to 10 are views illustrating a method of manufacturing a GaN solar cell according to an embodiment.

FIGS. 11 to 14 are views illustrating a method of manufacturing a GaN-based tandem type solar cell according to another embodiment.

FIGS. 15 to 31 are views illustrating a method of manufacturing a silicon-GaN-based tandem type solar cell according to another embodiment.

DETAILED DESCRIPTION OF THE EMBODIMENTS

Figure 1:
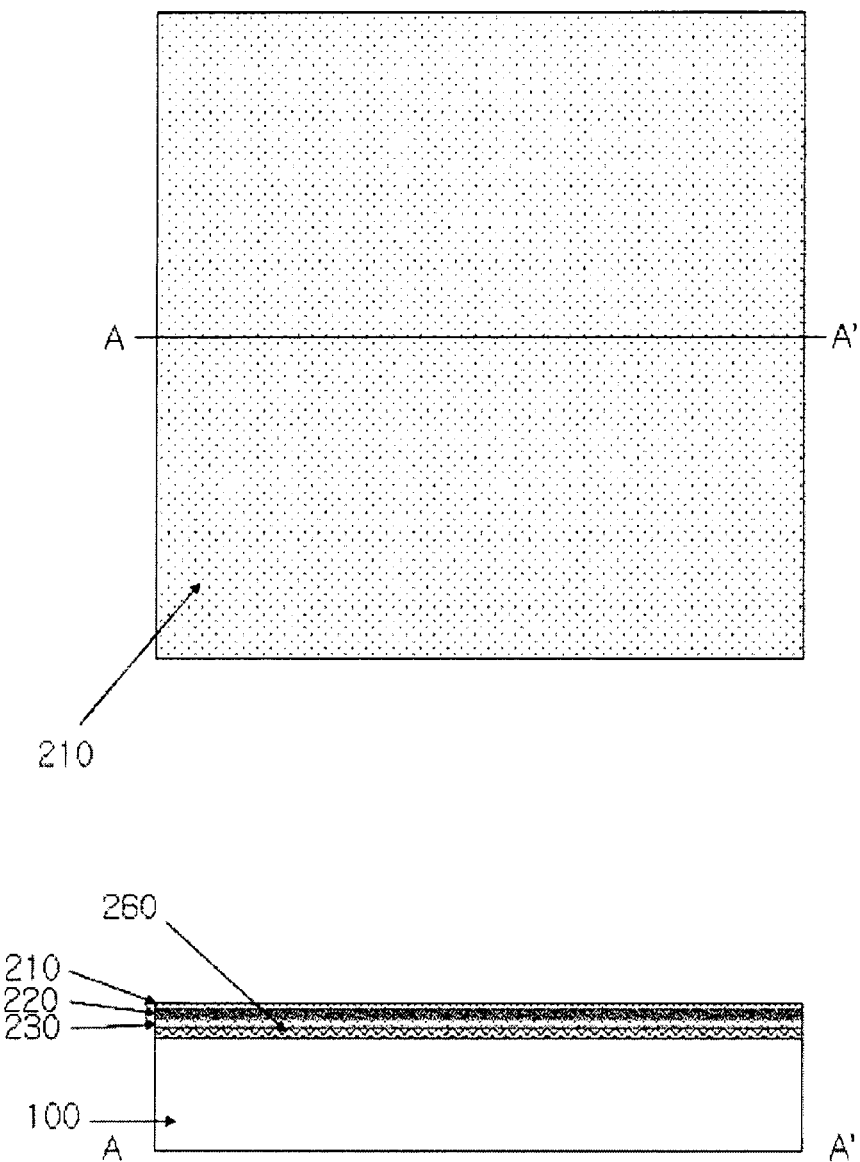

Hereinafter, the present disclosure will be described in detail with reference to accompanying drawings. In the drawings, the widths, lengths, and thicknesses of the components may be exaggerated for clarity. Like reference numerals in the drawings denote like elements, and thus their description will be omitted. The drawings attached to the present disclosure illustrate entire plan views and partial sectional views taken along line A-A'.

According to the present invention, a high-temperature process may be performed, and solar cells may be stacked on a sacrificial substrate (e.g., a silicon substrate) having superior alignment after the process to transfer it onto a flexible substrate. Also, the present disclosure provides a method of manufacturing a solar cell, which may have superior efficiency equal to that of a GaN type solar cell and effectively overcome a limitation (particularly, a GaN crystal structure and its growth are limited by substrate characteristics), which is limited to a type of substrate.

Also, a term "flexible" used in the present disclosure is distinguished from a term "rigid" expressed for a silicon substrate having a rigid characteristic. The flexible substrate may include a plastic substrate, which has a characteristic capable of being bent or folded at a predetermined angle. A sacrificial substrate used in this specification represents a temporary substrate, which is removed after a solar cell device is first manufactured, i.e., a temporary substrate for manufacturing the solar cell device.

Hereinafter, a method of manufacturing a solar cell according to the present disclosure will be described in detail with reference to accompanying drawings.

Referring to FIG. 1, an AlN buffer layer 260, an n-GaN layer 230 in which an n-type dopant is doped, an InGaN layer 220 in which a dopant is not doped, and a p-GaN layer 210 in which a p-type dopant is doped are sequentially stacked on a sacrificial substrate, i.e., a silicon substrate 100 having a (1, 1, 1) crystal structure. The foregoing structure may be realized as a GaN-based solar cell. Also, the foregoing structure may be a structure in which an n-GaN layer/p-GaN layer in which holes or electrons flow is vertically stacked on the InGaN layer. According to the present disclosure, since a stacking process (for example, a chemical vapor deposition (CVD) process) of the device layer is performed on the sacrificial substrate, a process application depending on a type of substrate is not limited. Thus, a kind of the sacrificial substrate is not to the silicon substrate, and various substrates such as a sapphire substrate may be used as the sacrificial substrate.

Referring to FIG. 2, the device layer of the solar cell stacked on the silicon substrate 100 that is the sacrificial substrate is etched and patterned to form one or more solar cell devices spaced a predetermined distance from each other on the silicon substrate 100.

The patterning process will now be described in detail. First, a photoresist layer is stacked and patterned on the device layer of the solar cell to form a protection layer for protecting a device region of the solar cell on the device layer. Thereafter, the exposed device layer is vertically etched. Here, the silicon substrate as well as the device layer may be etched to a predetermined depth by the etch process. A lateral surface of the partially etched silicon substrate serves as a starting point at which the etch process starts in a horizontal direction, but in a vertical direction. This will now be described in detail.

As described above, the etch process may be divided into a first etch for selectively etching only the device layer and a second etch for etching the silicon substrate by a predetermined depth. However, as shown in FIG. 2, if a technology in which an entire device layer of a solar cell is etched and a silicon substrate is etched by a predetermined depth is realized through any method known to those skilled in the art, this technology may be included within the scope of the present disclosure.

Figure 3:
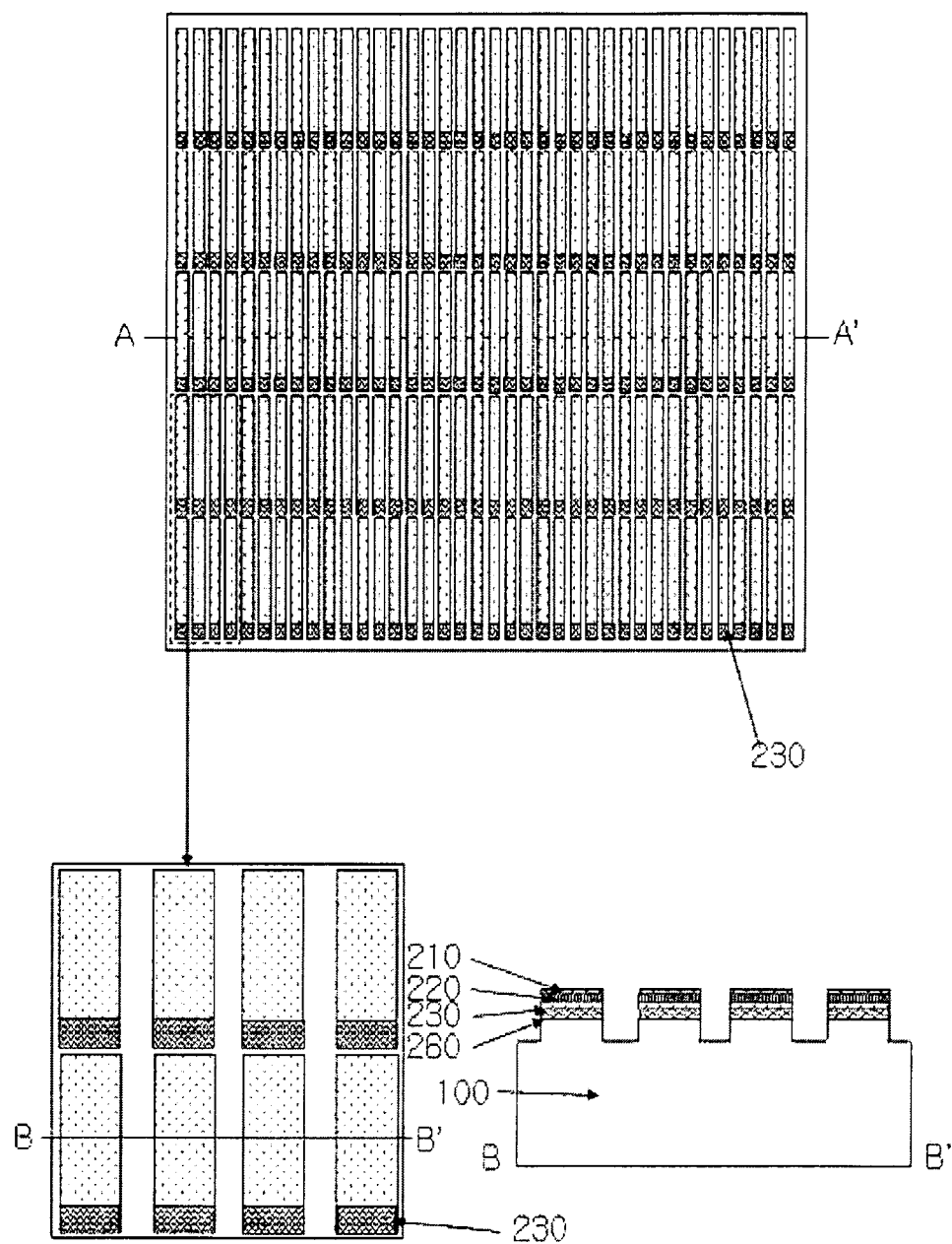

Referring to FIG. 3, a portion of each of the solar cell devices is etched to expose the n-GaN layer 230 disposed below the InGaN layer 220. An ohmic contact on which a metal layer will be stacked later may be formed in the exposed n-GaN layer.

Figure 4:
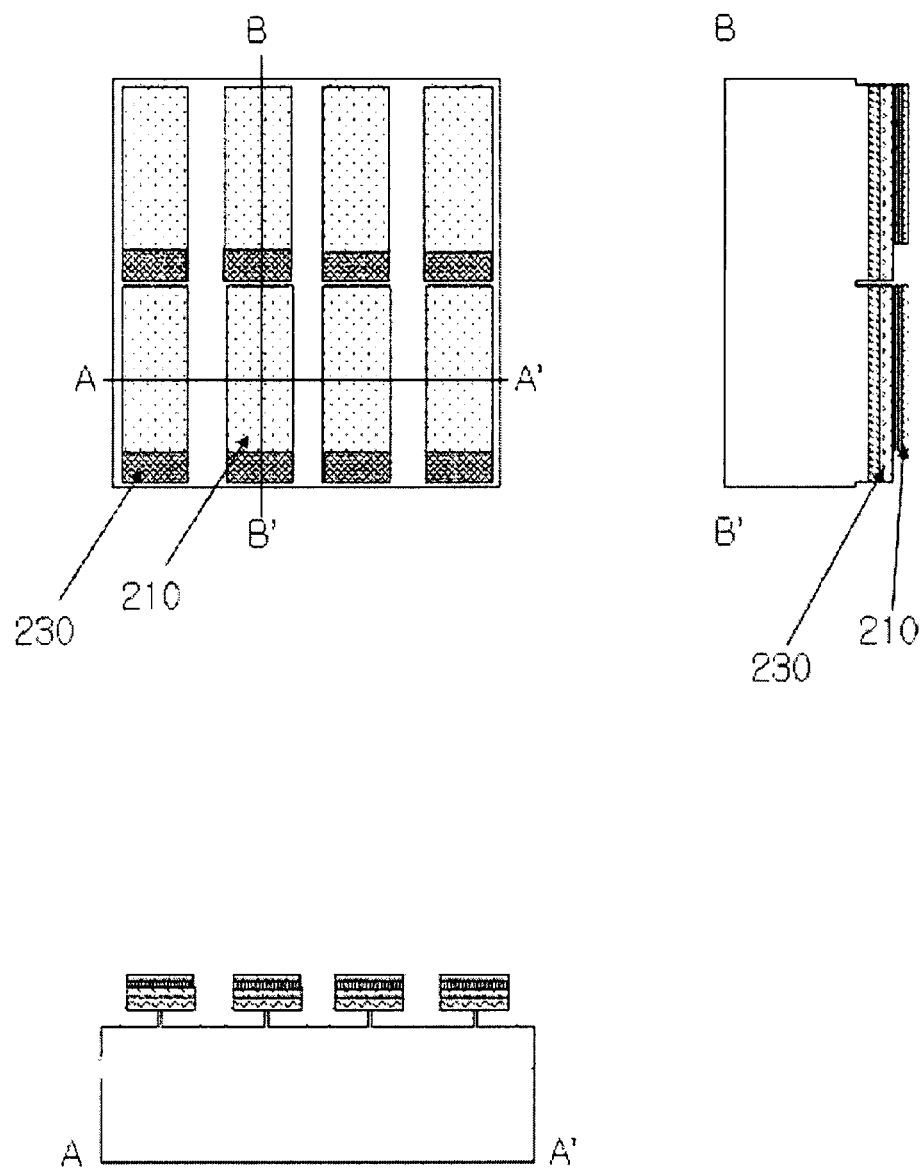

Referring to FIG. 4, the sacrificial substrate disposed below the device layer, i.e., the silicon substrate 100 is etched to remove the GaN-based solar cell from the substrate. However, a small portion of a lower portion of each of the solar cell devices is not etched, and thus remains. Thus, the solar cell devices may be aligned in a patterned state. The silicon substrate may be etched in various manners. Here, an etchant that has an etch rate in a lateral direction greater than in a vertical direction may be used. For example, in case of (1, 1, 1) single crystal silicon, when an anisotropic etch due to a wet etch is oriented along a (1, 1, 0) direction, a uniform lateral etching directionality may be achieved. Here, when an etch solution such as TMAH or KOH is used as the etchant, an etch rate is different according to crystal directions. Thus, in case of an etch rate of (101):(100):(111)=300:600:1, the anisotropic etch in the (110) direction, i.e., a horizontal direction may be effectively realized.

Referring to FIG. 5, a Ni/Au layer is stacked on the exposed n-GaN layer 230 of FIG. 3 and the p-GaN layer 210 of the device layer facing the exposed n-GaN layer 230 to form an ohmic contact 270. A process for forming the ohmic contact will now be described. A Ti/Al/Mo/Au layer or the Ni/Au layer may be stacked on the exposed n-GaN layer 230 and the p-GaN layer 210 of the device layer facing the exposed n-GaN layer 230 to perform a rapid thermal annealing (RTA) process at a high temperature of about 850° C. for about 30 seconds. Here, since a rigid substrate such as the silicon substrate may be used as the substrate, the substrate may well endure the high-temperature process for forming the ohmic contact.

Referring to FIG. 6, a stamping processor 300 contacts the solar cell devices in which the ohmic contact is formed. Here, the stamping processor may be formed of polydimethylsiloxane (PDMS). Thus, even though the ohmic contact protrudes from a top surface of the p-GaN layer 210, the PDMS may sufficiently contact the solar cells due to the flexible PDMS.

Referring to FIG. 7, the stamping processor 300 is removed from the silicon substrate 100. Here, the stamping processor 300 is removed from the plurality of solar cells, which contact the stamping processor 300, or the silicon substrate. Also, the solar cell devices adhering to the stamping processor 300 are maintained in an accurate therebetween. When the plurality of solar cells is removed from the silicon substrate, an extremely small amount of residue of the silicon substrate serving as a bridge between the substrate and the solar cells may be generated. The extremely small amount of residue may not affect operations of the solar cells.

Figure 8:
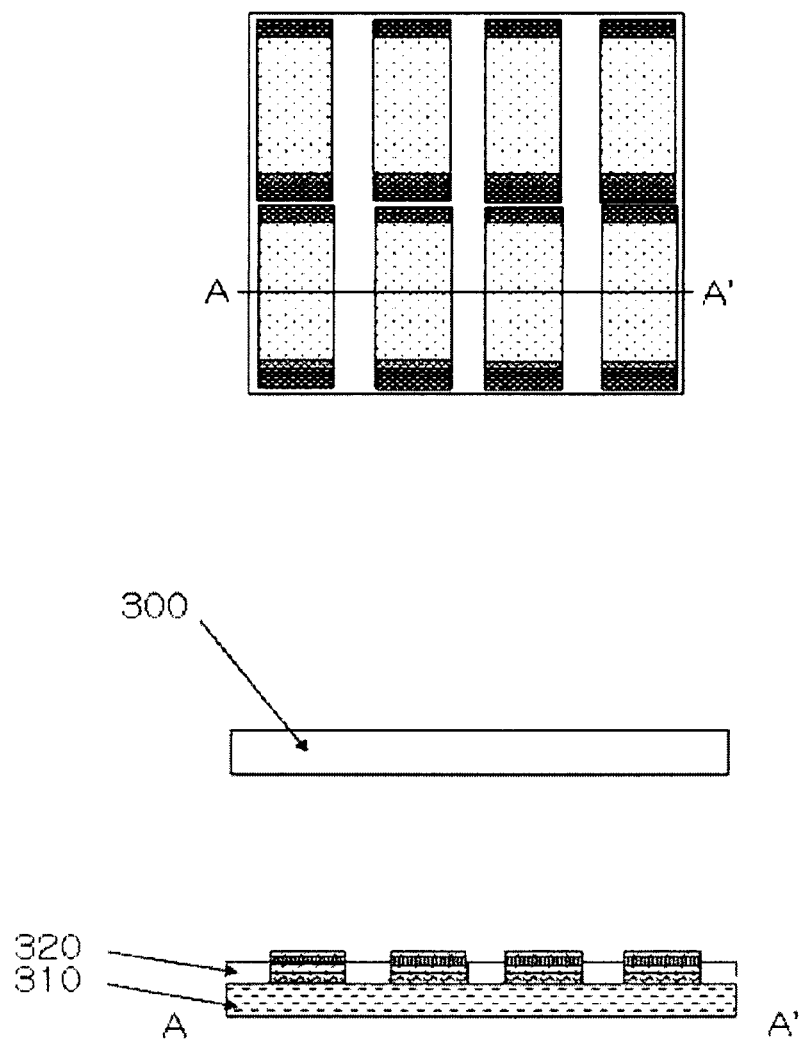

Referring to FIGS. 8 and 9, the solar cell devices removed from the silicon substrate are transferred onto a receiving substrate 310, e.g., the plastic substrate. The receiving substrate may be a flexible substrate. Thereafter, a conductive metal layer 330 that is disposed above the solar cells to electrically connect the n-GaN layer 230 and the p-GaN layer 210, which are disposed on each of the solar cell devices, to each other is stacked. Here, a polymer layer 320 for maintaining a height of the conductive metal layer 330 may be stacked between the conductive metal layer 330 and the receiving substrate 310. The polymer layer 320 may prevent the receiving substrate from being deformed by being deposed during the stacking process of the conductive metal layer 330. For example, the polymer layer may be formed of polyimide or norland.

Figure 10:
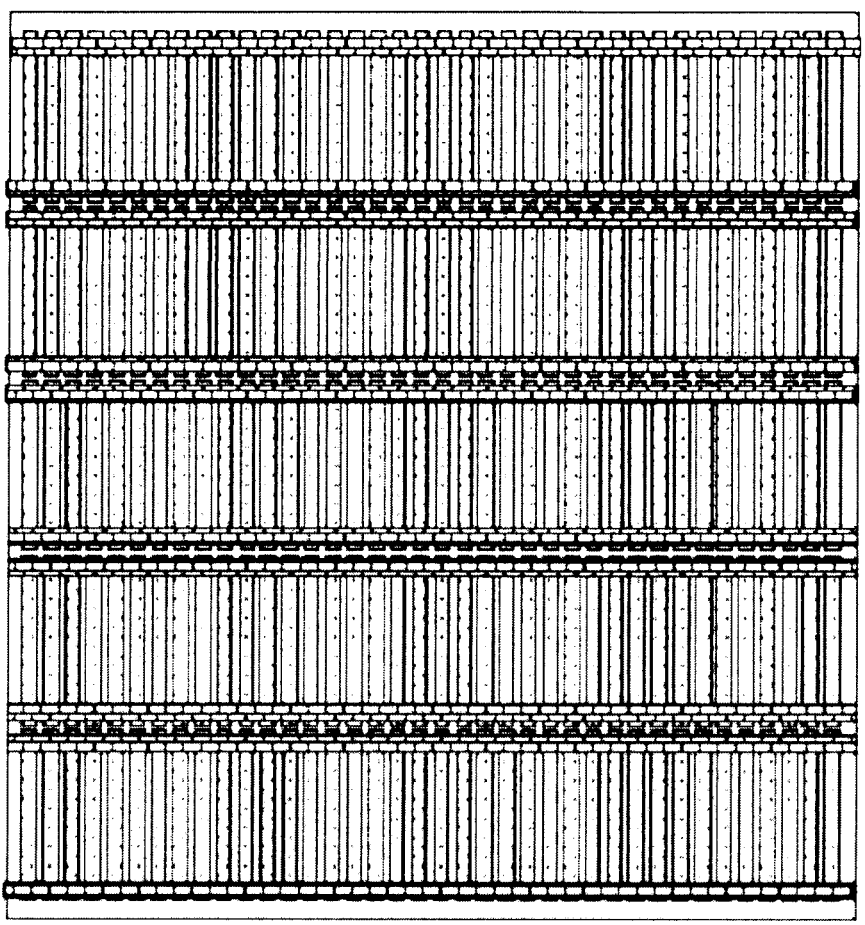

FIG. 10 is a plan view of a complete flexible solar cell manufactured by the foregoing process. According to the flexible solar cell of the present disclosure, as described above, since the high-temperature semiconductor process is completely performed using the rigid sacrificial substrate to manufacture the solar cell, and then, the manufactured solar cell is transferred onto the flexible substrate, the alignment of the devices may be superior and a large-area solar cell may be manufactured. For example, although the solar cell devices are manufactured using a small-sized sacrificial substrate, since the stamping processors may be used several times to transfer the solar cell onto the single receiving substrate, the large-area solar cell may be manufactured.

FIGS. 11 to 14 are views illustrating a method of manufacturing a GaN-based solar cell having a tandem structure, i.e., a flexible solar cell having a multi-layered structure according to another embodiment.

Figure 11:
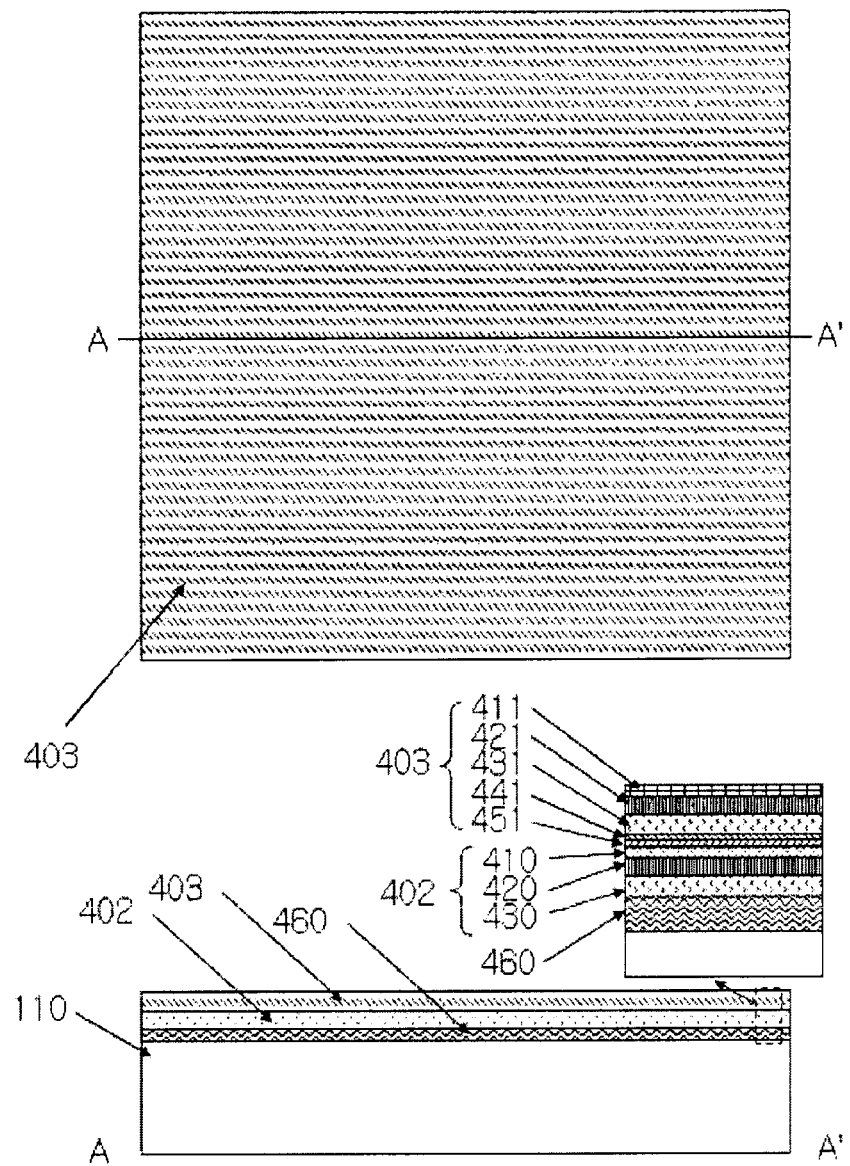

Referring to FIG. 11, two solar cell device layers 403 and 402 may be sequentially stacked on a silicon substrate that is a sacrificial substrate, i.e., a single crystal substrate having a (111) crystal structure. The lower first solar cell device layer 402 of the two solar cell device layers 403 and 402 having the tandem structure includes an n-GaN layer 430 in which an n-type dopant is doped, an InGaN layer (i-InGaN) 420 in which a dopant is not doped, and a p-GaN layer 410 in which a p-type dopant is doped, which are stacked on an AlN buffer layer 460 for preventing a silicon substrate and the GaN layers from being lattice-misaligned. The second solar cell device layer 403 is stacked on the first solar cell device layer 402. The second solar cell device layer 403 includes a p+-GaN layer 451 in which a high-concentration p-type dopant is doped, an n+-GaN layer 441 in which a high-concentration n-type dopant is doped, an n-GaN layer 431 in which the n-type dopant is doped, an InGaN layer 421 in which a dopant is not doped, and a p-GaN layer 411 in which the p-type dopant is doped, which are sequentially stacked. The p+-GaN layer 451 in which the high-concentration p-type dopant (here, the high-concentration represents a concentration greater than that of the p-GaN layer 411) may electrically connect the second solar cell device layer 403 to the first solar cell device layer 402 using a tunneling effect thereof. That is, electrons and holes generated from the first and second solar cell device layers 403 and 402 are respectively moved into the n-GaN layer 430 of the first solar cell device layer 402 and the p-GaN layer 411 of the second solar cell device layer 403 to form a common electric potential of the solar cell.

Figure 12:
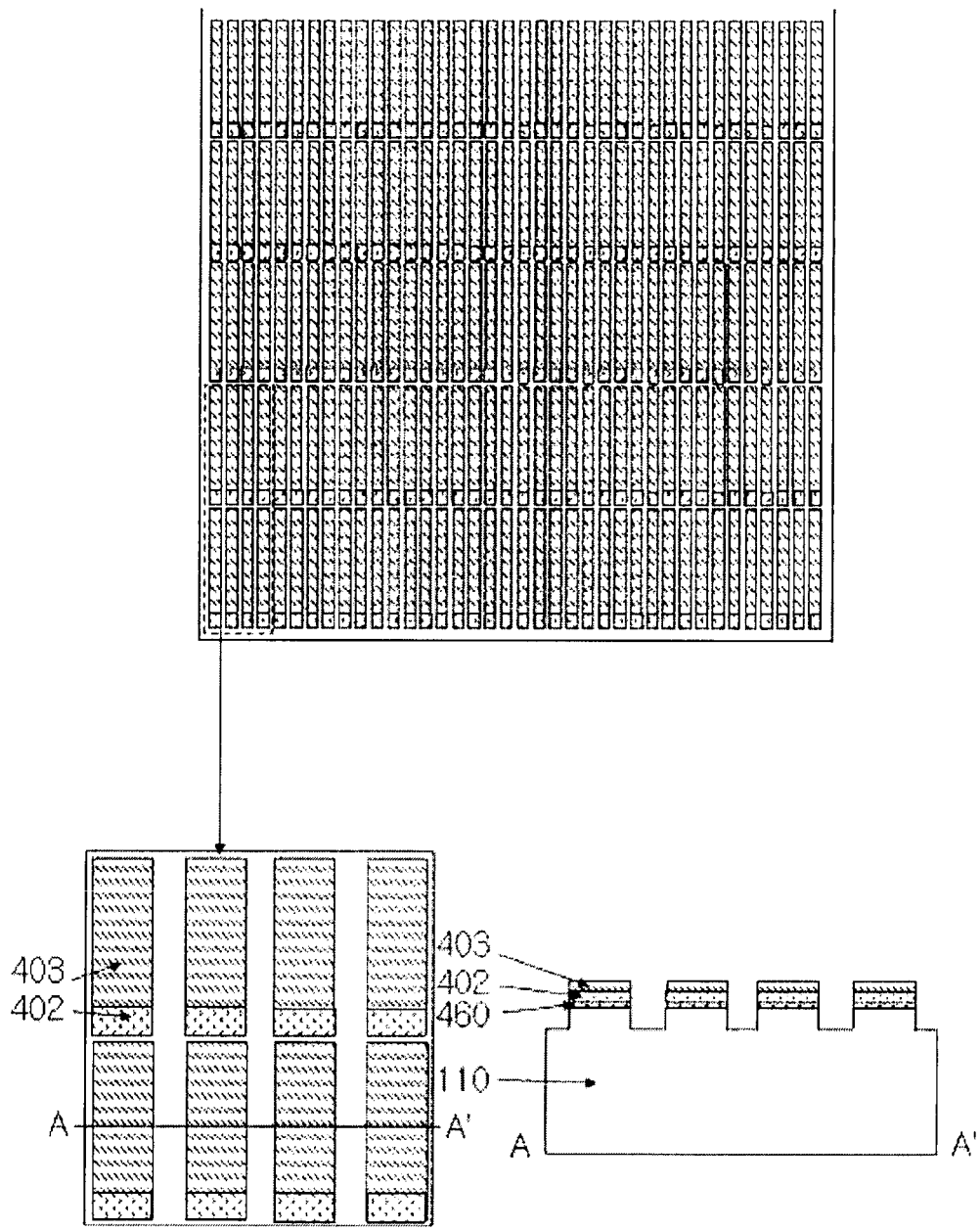

Referring to FIG. 12, the solar cell device layers 402 and 403 having the tandem structure are patterned to form a plurality of unit solar cells spaced a predetermined distance from each other. The patterning process is performed to vertically etch the GaN device layer, i.e., the first and second solar cell device layers 402 and 403 as well as a lower silicon substrate by a predetermined depth. Here, a lateral surface of the etched silicon substrate may provide a starting position of an anisotropic etch process (that will be performed later) for removing the devices. Also, the second solar cell device layer 403 in a portion of a region of the solar cell device layers 402 and 403 having the tandem structure is removed to expose the lower first solar cell device layer 402. Thus, a contact structure in which electricity generated from the first and second solar cell device layers 402 and 403 is connected to an external device may be formed.

Thereafter, the exposed silicon substrate is anisotropically etched, and the solar cell device layers 402 and 403 having the tandem structure are removed from the silicon substrate. Then, the removed solar cell device layers 402 and 403 are transferred onto a receiving substrate 530. Here, since the anisotropic etch process may be performed using the same method as that of FIG. 4, its detailed description will be omitted. Also, since the transferring process may be performed using the same method as those of FIGS. 6 to 8, its detailed description will be omitted.

Referring to FIG. 13, a conductive metal layer 510 formed of Al/Au is stacked above the first solar cell device layer 402 to electrically connect the plurality of first solar cell device layers 402 to each other. Similarly, the conductive metal layer 510 is stacked over the second solar cell device layer 403 to electrically connect the plurality of second solar cell device layers 403 to each other. As described above, a polymer layer 520 is stacked between the receiving substrate and the metal layer 510 to protect the receiving substrate when the metal layer 510 is deposited and support the metal layer 510 having a line shape.

Figure 14:
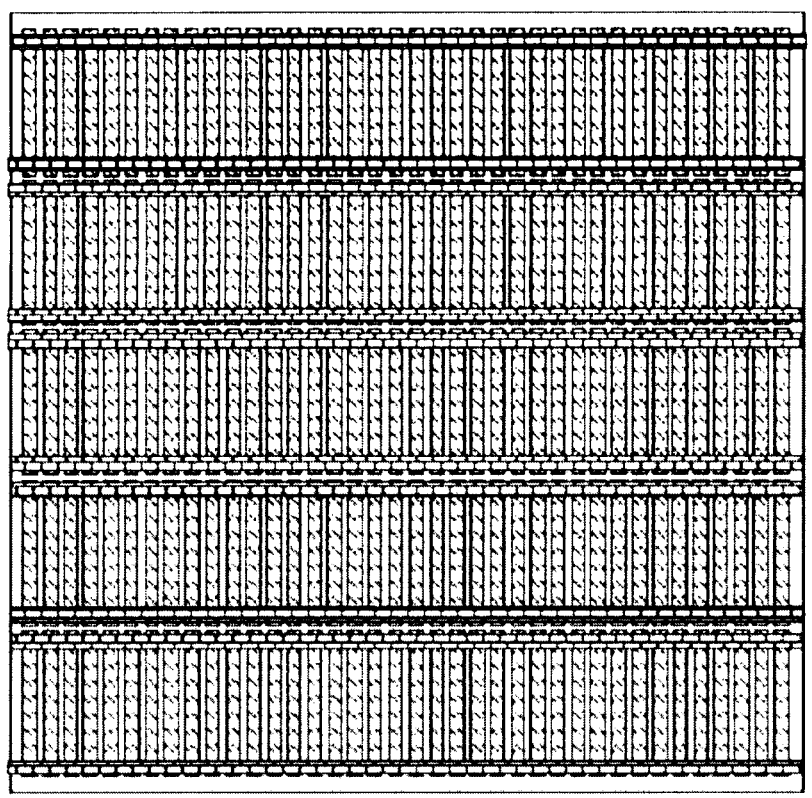

FIG. 14 is a sectional view after the solar cell having the tandem structure is formed on the flexible substrate. Particularly, in the solar cell having the tandem structure, i.e., the flexible tandem type solar cell according to an embodiment, the solar cell having the multi-layered structure is previously manufactured on the silicon substrate, and then, the solar cell is transferred onto the flexible substrate. Thus, a solar cell module may have a superior device alignment, and also, an economical process may be performed.

FIGS. 15 to 31 are views illustrating a process of manufacturing a silicon-GaN-based tandem type solar cell according to another embodiment, and plan views of the resultant solar cell. In the present embodiment, a tandem type solar cell that has a multi-layered structure in which a silicon solar cell is disposed at a lower side, and a GaN solar cell is disposed at an upper side is disclosed to further improve efficiency.

Figure 15:
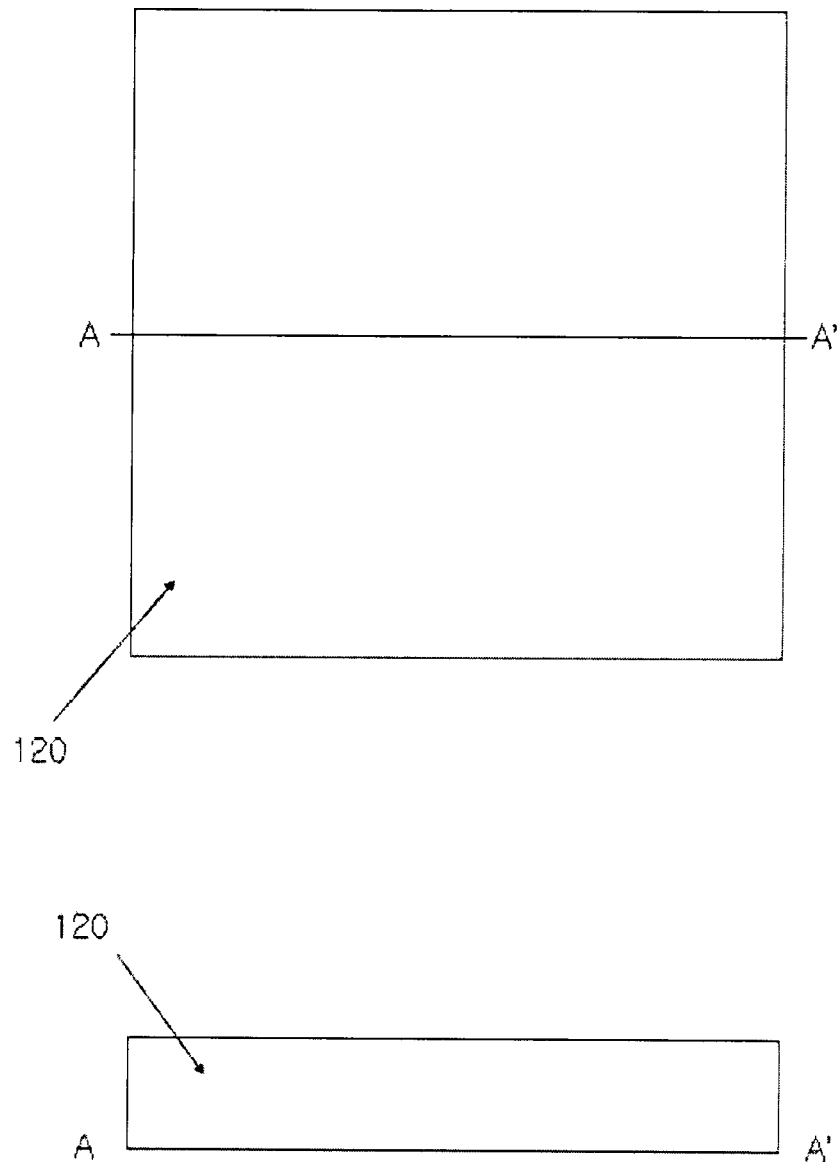

Referring to FIG. 15, a polycrystalline silicon substrate 120 is disclosed.

Figure 16:
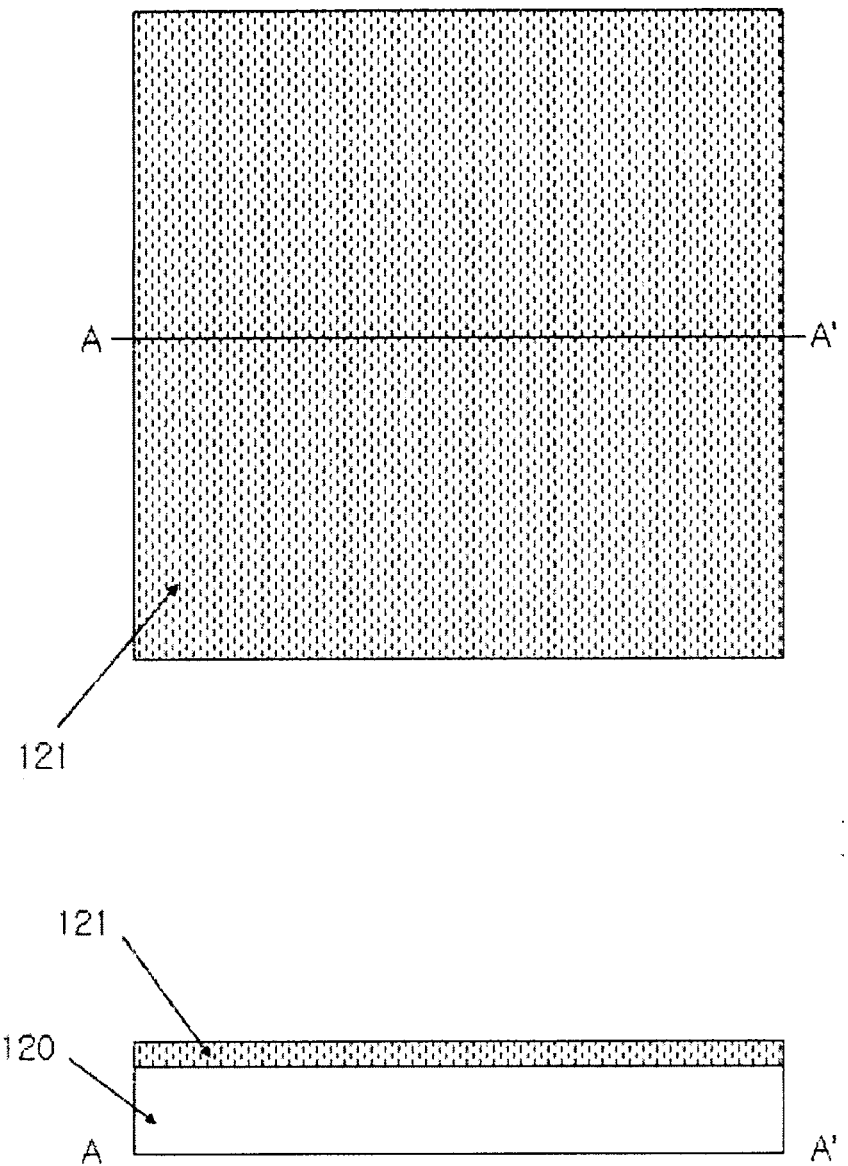

Referring to FIG. 16, a p-type dopant such as boron is doped into the polycrystalline silicon substrate 120 to form a p-type doped layer 121 on a silicon substrate. Particularly, the p-type doped layer 121 of the silicon substrate 120 forms a device layer of the silicon solar cell.

Figure 17:
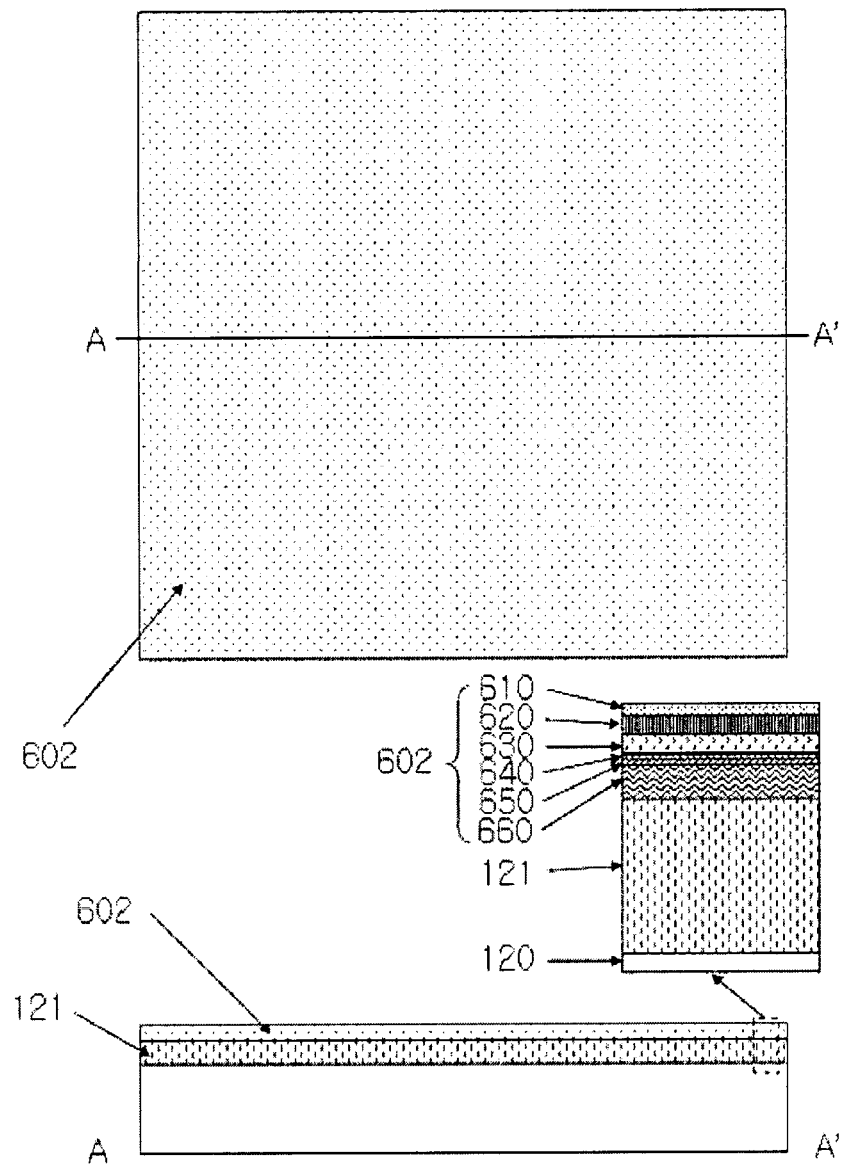

Referring to FIG. 17, a GaN solar cell device layer 602 is stacked on the p-type doped layer 121. The GaN solar cell device layer 602 has a structure in which an AlN buffer layer 660 for buffering a lattice misalignment with silicon, a p+-GaN layer 650, an n+-GaN layer 640, an n-GaN layer 630, an InGaN layer 620, and a p-GaN layer 610 are sequentially stacked. Here, the AlN buffer layer 660 is a layer for reducing the lattice misalignment. The p+-GaN layer 650 and the n+-GaN layer 640 serve as a conductive part, which causes a tunneling phenomenon to allow electricity to flow between the lower silicon solar cell and the upper GaN solar cell. The n-GaN layer 630, the InGaN layer 620, and the p-GaN layer 610 serve as the GaN solar cell. There descriptions are as mentioned above.

Figure 18:
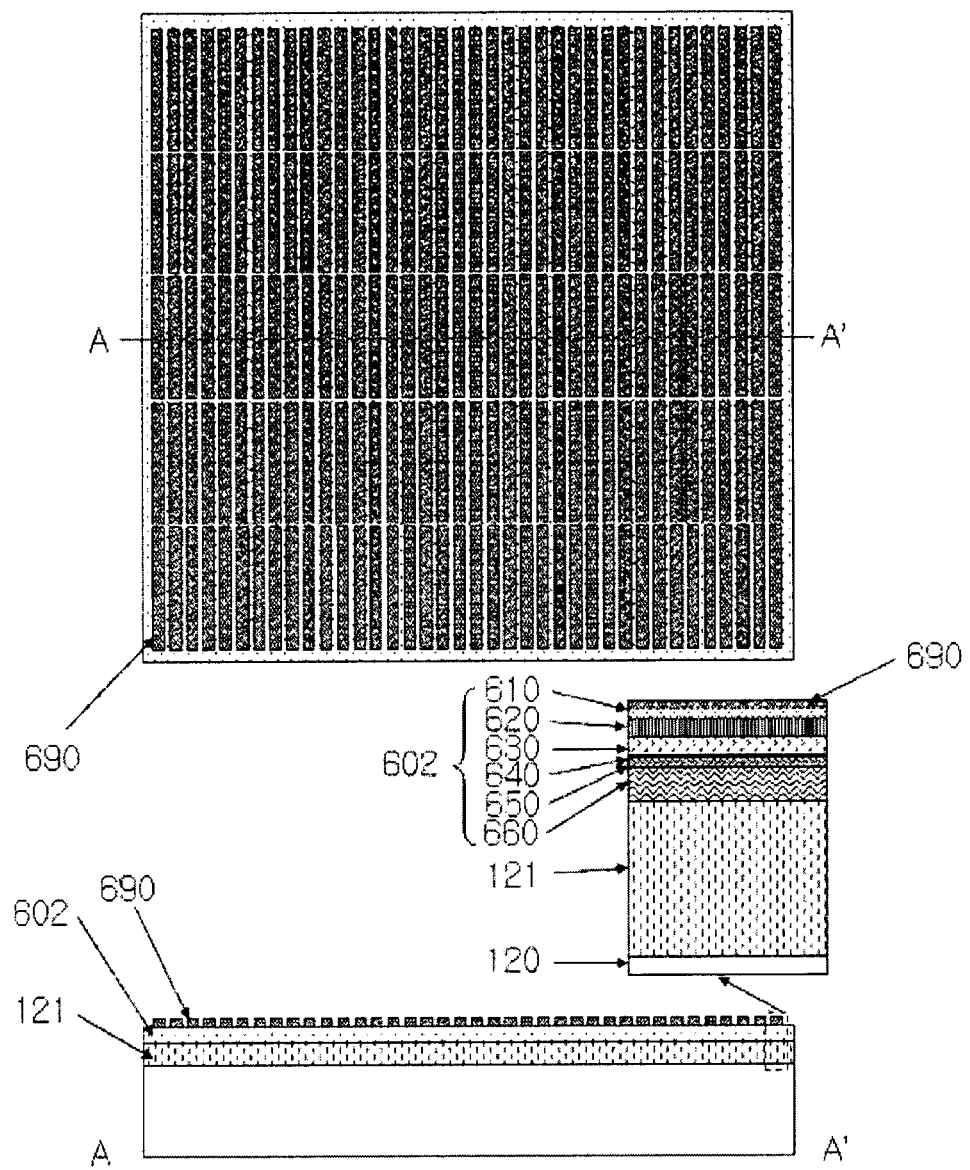

Referring to FIG. 18, a protection layer 690 formed of nitride is stacked on the device layer 602, and then is patterned. Particularly, since the protection layer 690 protects a solar cell device region during an etch process, the protection layer 690 is patterned in a shape equal to that of an actual device.

Figure 19:
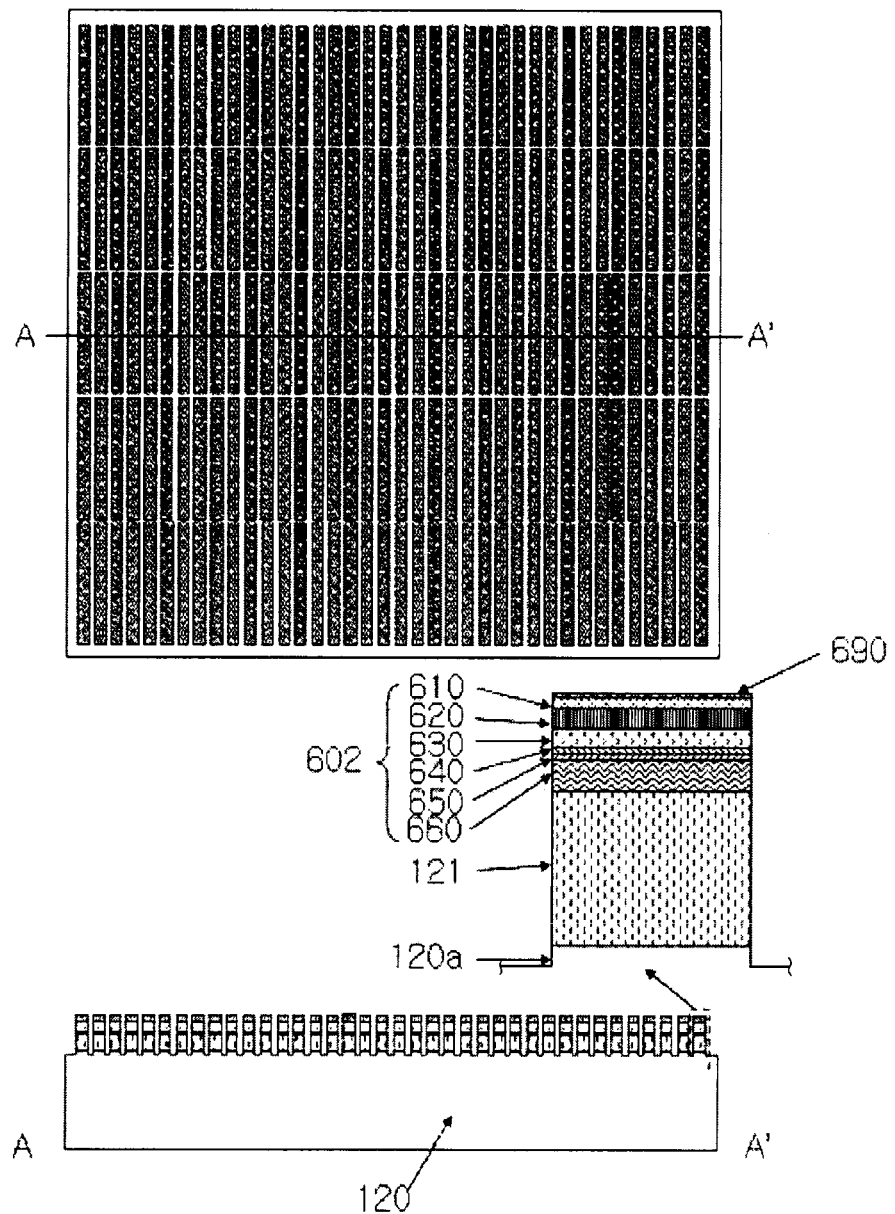

Referring to FIG. 19, the device layer 602 exposed between the patterned protection layers 690 is vertically etched to form a plurality of solar cells spaced a predetermined distance from each other on the silicon substrate. Here, the silicon substrate is further etched by a predetermined depth to remain a certain region 120a of the silicon substrate having a predetermined height, i.e., a predetermined thickness at a lower portion of the solar cell. Since the certain region 120a of the silicon substrate has a very thin thickness, a tandem type solar cell to be achieved by the present disclosure, i.e., the lower silicon and the upper GaN solar cell may be formed. Here, the certain region 120a of the silicon substrate may have a thickness of about 10 μm to about 50 μm. If the certain region 120a has a thickness less than the foregoing range, it is difficult to achieve sufficient solar cell efficiency due to the much thin silicon substrate. On the other hand, if the certain region 120a is very thick, it is difficult to maintain a flexible property.

Figure 20:
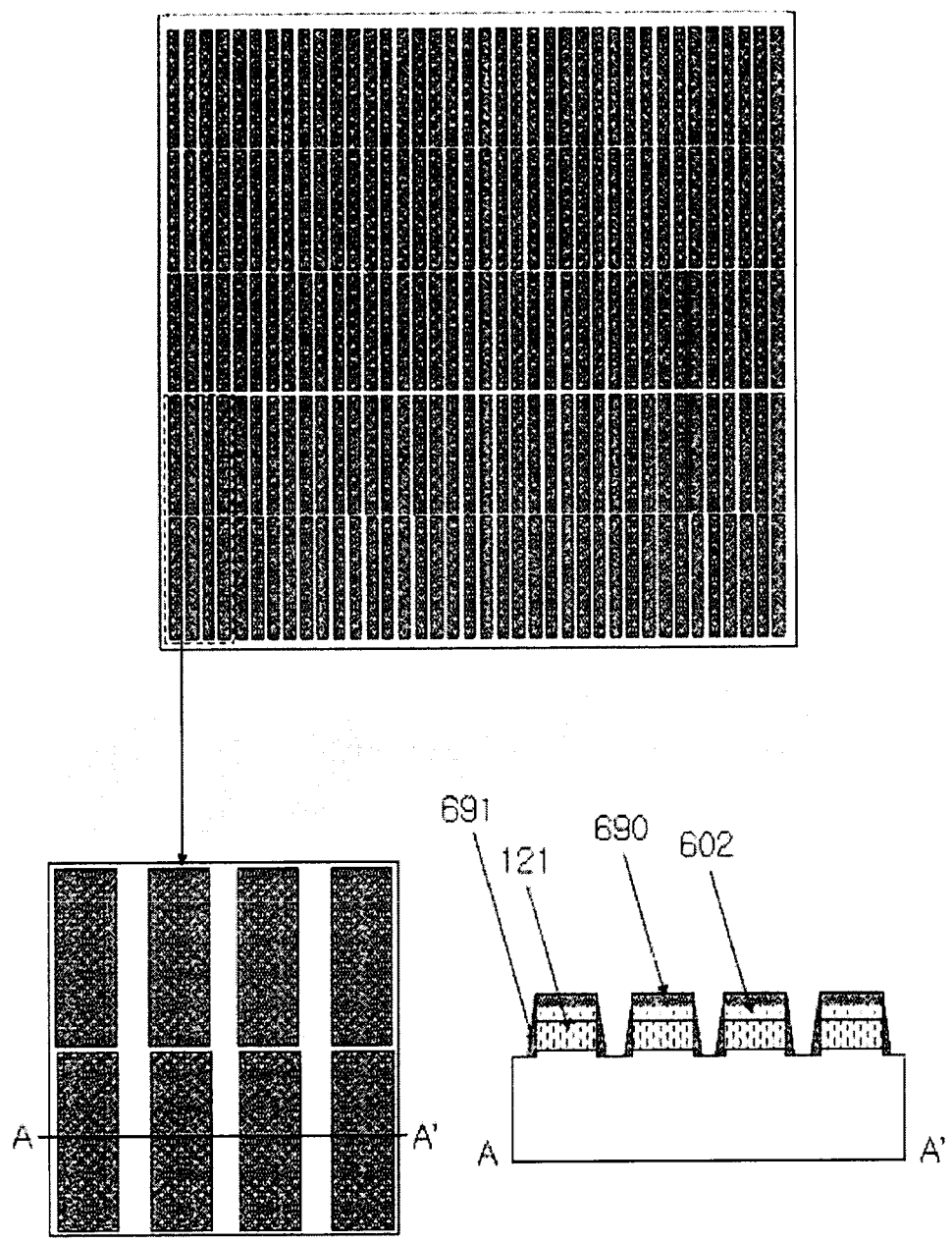

Referring to FIG. 20, a spacer 691 formed of a material such as nitride (SiN) and protecting a lateral surface of the solar cell in a successive process is stacked on the lateral surface of the patterned solar cell device. Particularly, the spacer 691 is disposed on a lateral surface of the silicon substrate 120a disposed below the device as well as the lateral surface of the solar cell device to protect the silicon substrate disposed below the device during the etch process.

Figure 21:
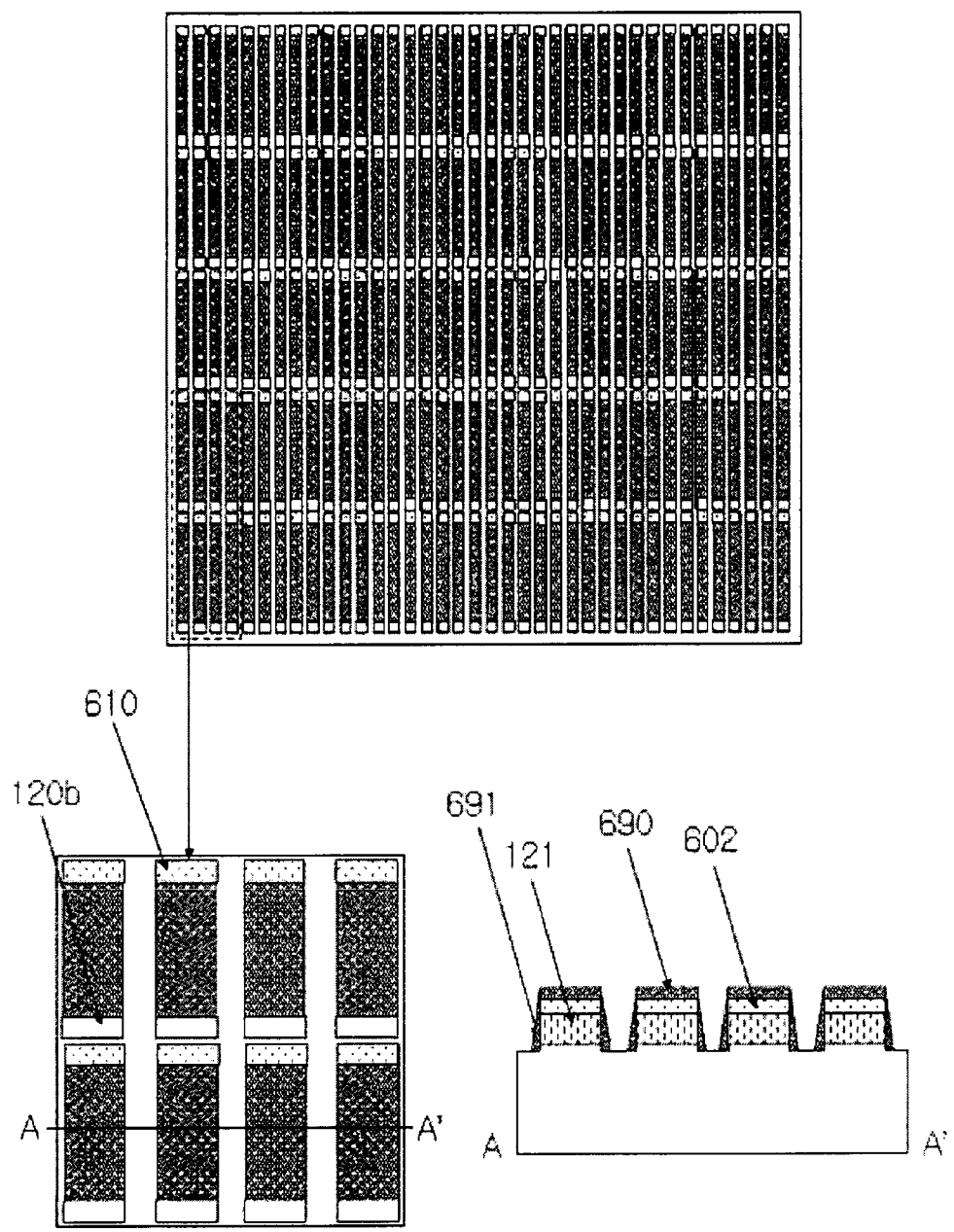
Figure 22:
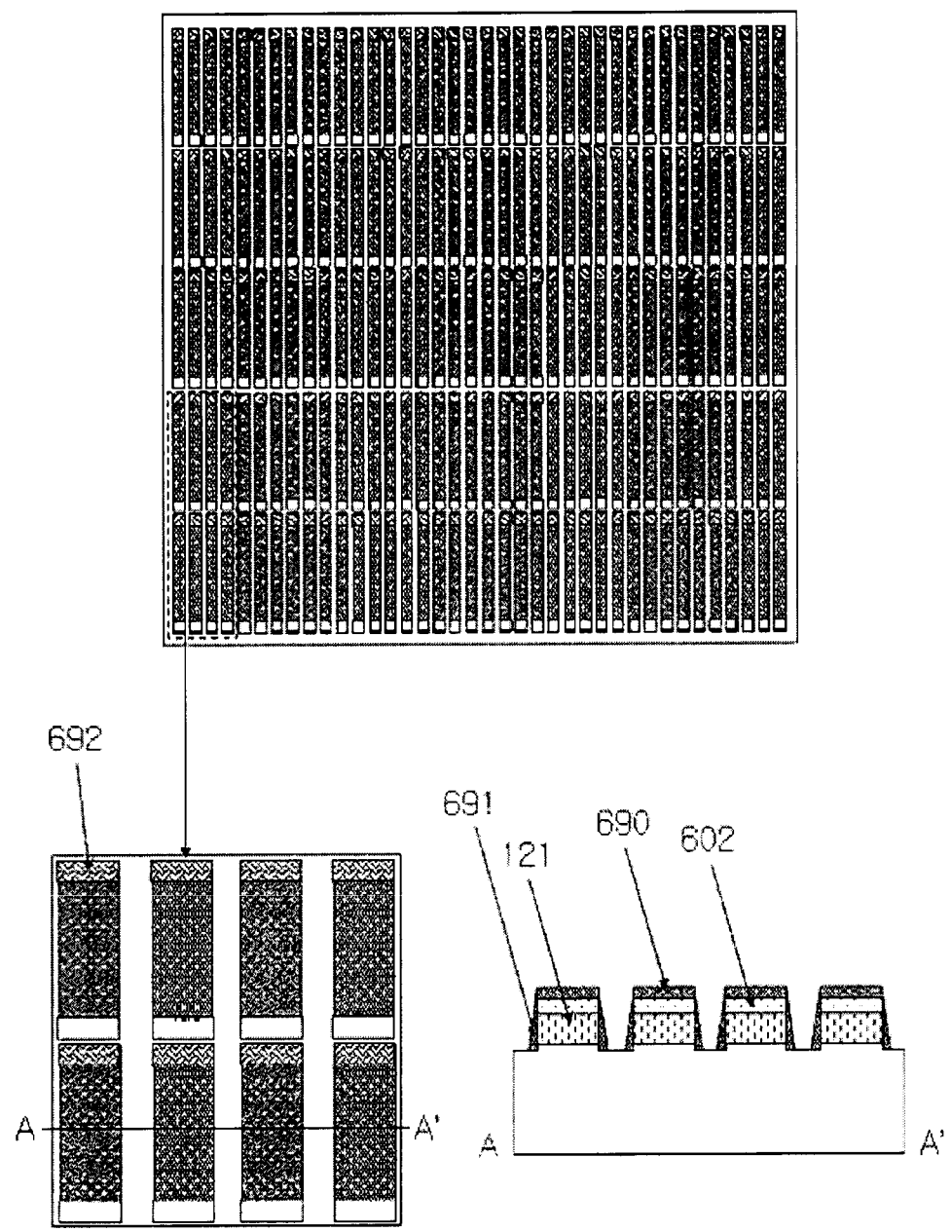

Referring to FIG. 21, a portion of a region of the solar cell device is etched to expose a certain region 120b of a lower silicon substrate layer of the solar cell device. That is, the silicon substrate 120 below the p-type doped layer in which the p-type dopant such as boron is doped into an upper portion thereof serves as the n-type solar cell layer. Furthermore, a region opposite to that of the exposed silicon substrate layer 120b is etched also to expose the p-GaN layer 610. Referring to FIG. 22, a metal layer is stacked on the p-GaN layer 610 of the exposed solar cell device to form an ohmic contact 692. Also, the metal layer, i.e., the ohmic contact is stacked and formed later on the silicon substrate layer 120b to form an n-type electrode and a p-type electrode. Since it is difficult to form the ohmic contact on the GaN layer when compared to the silicon layer, the ohmic contact, i.e., the metal layer is first stacked on the GaN layer, and then, another ohmic contact is formed on the silicon substrate layer 120b.

Figure 23:
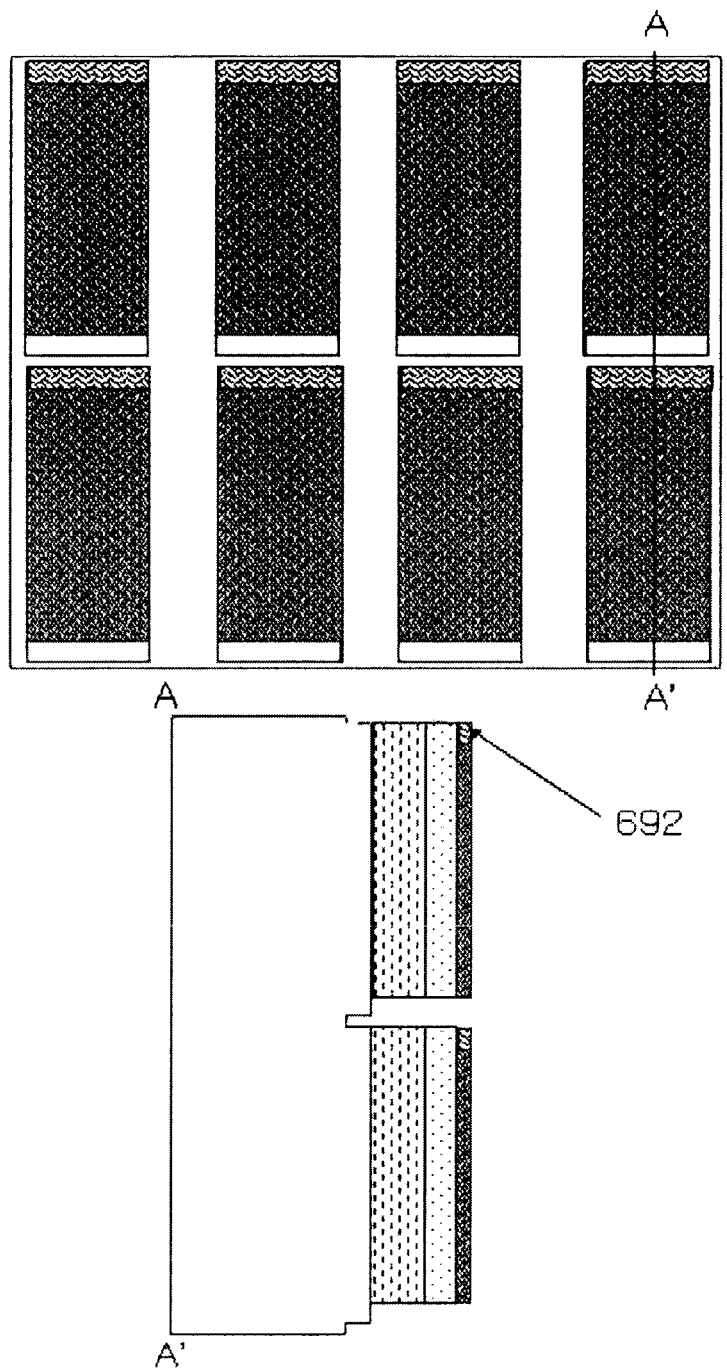
Figure 25:
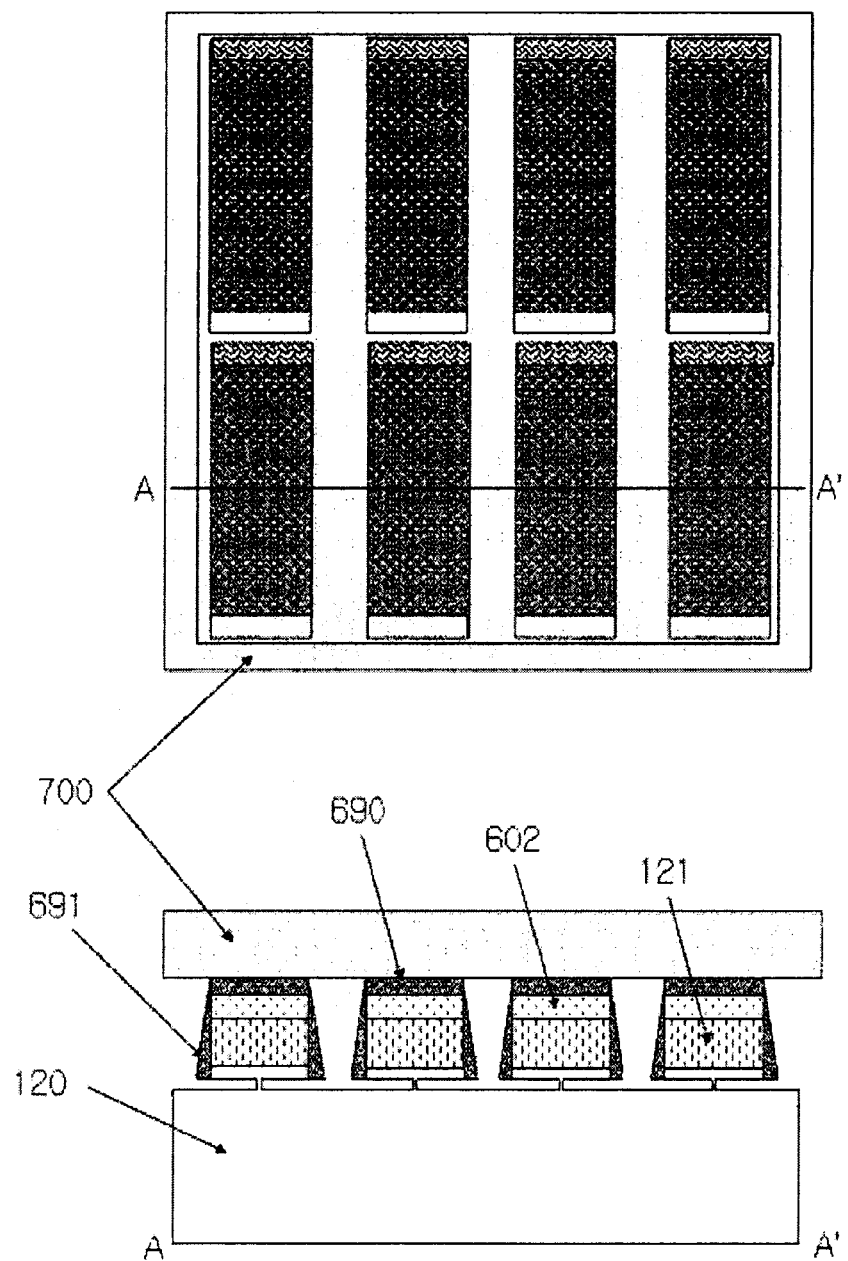
Figure 27:
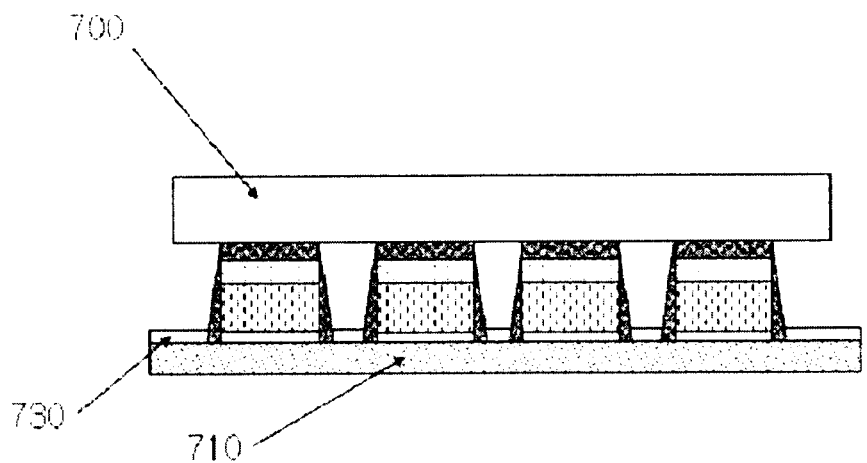
Figure 28:
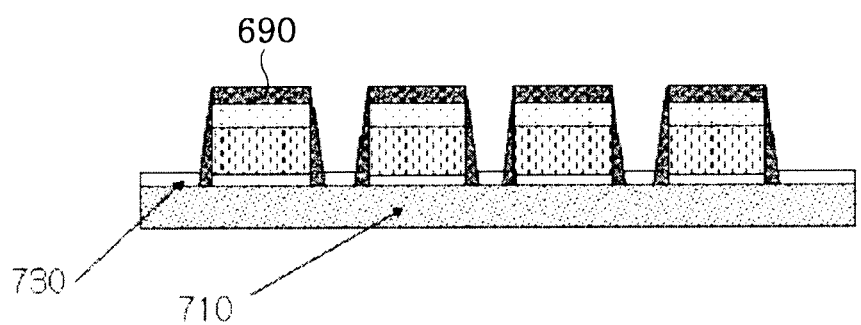

FIG. 23 is a cross-sectional view of the solar cell device of FIG. 22. Referring to FIG. 23, the ohmic contact 692 is formed on the p-GaN layer, and the silicon substrate 120 is exposed to a side opposite to that of the ohmic contact 692. Another metal layer may be stacked on the exposed silicon substrate 120b.

Referring to FIG. 24, the silicon substrate 120 exposed between the spacers 691 is anisotropically etched. Here, the certain region 120a of the silicon substrate formed on the lateral surface of the spacer 691 is not anisotropically etched. Thus, the certain region 120a of the silicon substrate having a predetermined thickness remains at the lower portion of the solar cell device to form the lower silicon solar cell.

Referring to FIGS. 25 to 28, a stamping processor 700, e.g., a solar cell device formed of PDMS, i.e., the solar cell device, in which the silicon substrate remains on the lower portion thereof, having the tandem structure is removed from the silicon substrate 120 and transferred onto a receiving substrate 710. Here, the receiving substrate may be a flexible substrate. A polymer layer 730, for example, a polymer such as polyimide may be stacked on the flexible substrate 710.

Figure 29:
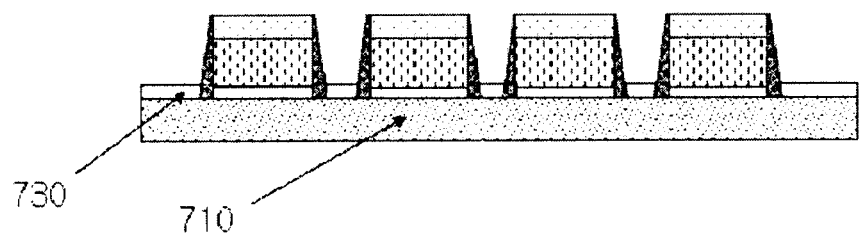

Referring to FIG. 29, the upper protection layer of the solar cell device transferred onto the flexible substrate 710 is removed. Thus, the tandem type solar cell device having a multi-layered structure including the upper GaN solar cell and the lower silicon solar cell is exposed to the outside.

Referring to FIG. 30, an ohmic contact 740 connected to the silicon layer that is the n-type electrode is stacked on the exposed lower silicon substrate 120b serving as the n-type solar cell layer of the silicon solar cell. Here, Ti/Au or Ni/Au may be used to form the ohmic contact 740. Ti, Ni, and Au are used to improve an adhesive between the silicon substrates, and Au is used to form the ohmic contact.

Thereafter, the ohmic contacts 692 and 740 formed on the p-GaN layer and the silicon layer are connected to each other by another conductive layer 750 to allow electricity flowing into each device to flow to the outside. Also, a polymer layer 730 may be stacked between the devices to prevent the devices from being laterally deformed.

Figure 31:
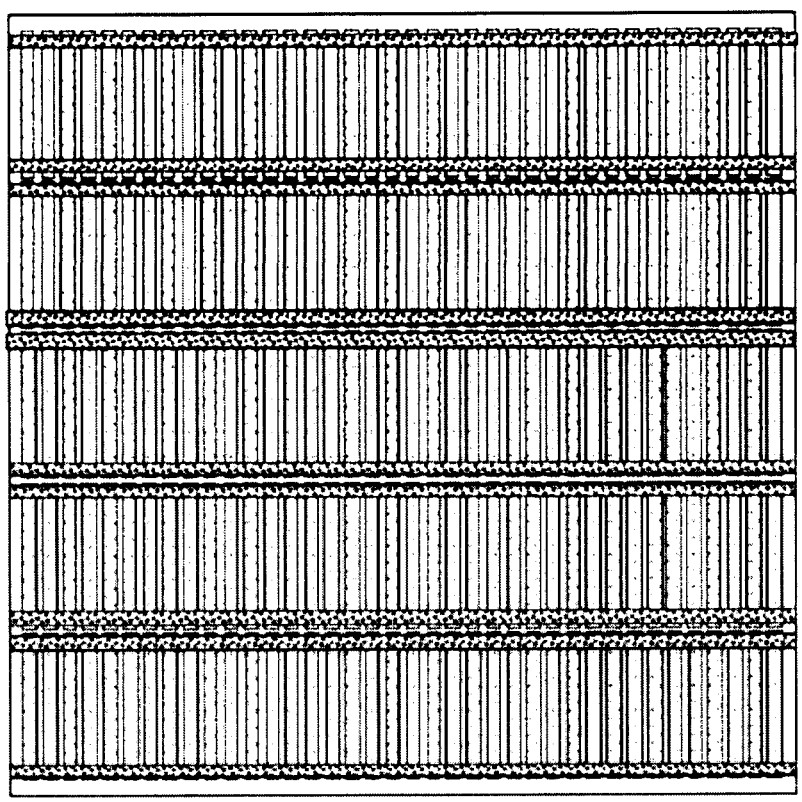

FIG. 31 is a plan view of the solar cell manufactured through the foregoing processes, i.e., the silicon-GaN-based tandem type solar cell formed on the flexible substrate.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a solar cell, the method comprising:
   doping p-type impurities into a silicon substrate to form a p-doped layer;
   stacking a solar cell device layer containing InGaN on the silicon substrate to form a solar cell device having one or more tandem structure of a lower silicon solar cell device layer comprising the p-doped layer and an upper GaN solar cell comprising a GaN solar cell device layer;
   stacking a protection layer on the solar cell device layer having the tandem structure to pattern the protection layer;
   etching the entire device layer and the lower silicon substrate by a predetermined depth in a vertical direction;
   forming spacers on lateral surfaces of the etched device layer and the silicon substrate etched by the predetermined depth;
   anisotropically etching the silicon substrate exposed between the spacers; contacting the solar cell devices to a stamping processor to remove the solar cell devices from the sacrificial substrate;
   transferring the solar cell devices onto a receiving substrate; and
   stacking an ohmic contact connected to a silicon layer that is a n-type electrode on the exposed lower silicon substrate serving as a n-type solar cell layer of the silicon solar cell device layer.

2. The method of claim 1, wherein the GaN solar cell device layer has a structure in which an AlN buffer layer, a high concentration p+-GaN layer, a high concentration n+-GaN layer, an n-GaN layer, an InGaN layer, and a p-GaN layer are sequentially stacked.

3. The method of claim 1, wherein the silicon has a crystal structure, and the anisotropic etch is performed in a direction.

4. The method of claim 1, wherein the one or more solar cell devices having the tandem structure are arranged in a plurality of rows, and one or more solar cells are disposed in each of the rows.

5. The method of claim 1, further comprising exposing at least portions of the p-GaN layer of the solar cell device layer and the lower silicon substrate to stack metal layers on at least portions of the exposed region.

6. The method of claim 1, wherein the metal layers are electrically connected to each other in correspondence with their polarities.

7. The method of claim 1, wherein the receiving substrate is a flexible substrate.

* * * * *